United States Patent
Peng et al.

(10) Patent No.: US 12,368,106 B2
(45) Date of Patent: Jul. 22, 2025

(54) DIAGONAL VIAS IN SEMICONDUCTOR STRUCTURES

(71) Applicant: Taiwan Semiconductor Manufacturing Company, Ltd., Hsinchu (TW)

(72) Inventors: Shih-Wei Peng, Hsinchu (TW); Chia-Tien Wu, Taichung (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 625 days.

(21) Appl. No.: 17/543,518

(22) Filed: Dec. 6, 2021

(65) Prior Publication Data

US 2022/0336360 A1    Oct. 20, 2022

Related U.S. Application Data

(60) Provisional application No. 63/175,326, filed on Apr. 15, 2021.

(51) Int. Cl.
*H01L 23/538* (2006.01)
*H01L 21/768* (2006.01)

(52) U.S. Cl.
CPC .... *H01L 23/5384* (2013.01); *H01L 21/76816* (2013.01); *H01L 21/76877* (2013.01); *H01L 23/5383* (2013.01); *H01L 23/5386* (2013.01)

(58) Field of Classification Search
CPC ............. H01L 23/5384; H01L 23/5383; H01L 23/5386; H01L 23/5226; H01L 21/76877; H01L 21/76879; H01L 21/76816
See application file for complete search history.

(56) References Cited

U.S. PATENT DOCUMENTS

| | | | | |
|---|---|---|---|---|
| 6,166,441 A * | 12/2000 | Geryk | ................ | H01L 23/5226 257/773 |
| 9,831,155 B2 * | 11/2017 | Lin | ........................ | H01L 24/00 |
| 10,103,233 B1 * | 10/2018 | Khalil | ................ | H01L 29/0696 |
| 10,952,313 B1 * | 3/2021 | Ko | ........................ | H05K 1/113 |
| 2005/0287800 A1 * | 12/2005 | Katase | ............. | H01L 21/76879 257/E21.59 |
| 2006/0046475 A1 * | 3/2006 | Wark | ..................... | H05K 1/115 257/E21.597 |
| 2006/0118967 A1 * | 6/2006 | Suga | ..................... | H01L 23/528 257/774 |
| 2013/0256902 A1 * | 10/2013 | Lu | ....................... | H01L 23/5283 257/774 |
| 2015/0097293 A1 * | 4/2015 | Yao | ....................... | H01L 23/522 257/773 |
| 2015/0129892 A1 * | 5/2015 | Lee | ...................... | H01L 23/481 257/77 |
| 2016/0283631 A1 * | 9/2016 | Lin | ........................ | G06F 30/39 |
| 2017/0110461 A1 * | 4/2017 | Fujiwara | ............ | H01L 27/0207 |
| 2018/0122812 A1 * | 5/2018 | Liaw | .................. | H01L 27/0207 |

(Continued)

*Primary Examiner* — Bac H Au
(74) *Attorney, Agent, or Firm* — Merchant & Gould P.C.

(57) ABSTRACT

A semiconductor structure including a first conductive layer, a second conductive layer situated above the first conductive layer, and a via extending diagonally between the second conductive layer and the first conductive layer to electrically connect the first conductive layer to the second conductive layer.

20 Claims, 20 Drawing Sheets

(56) References Cited

U.S. PATENT DOCUMENTS

| | | | |
|---|---|---|---|
| 2019/0148287 A1* | 5/2019 | Chang | H01L 23/5283 |
| | | | 257/368 |
| 2020/0027832 A1* | 1/2020 | Varghese | H01L 27/0688 |
| 2021/0098368 A1* | 4/2021 | Yu | H01L 21/76852 |
| 2021/0098407 A1* | 4/2021 | Elsherbini | H01L 24/08 |
| 2021/0272895 A1* | 9/2021 | Wu | H01L 21/76895 |
| 2022/0415779 A1* | 12/2022 | Dogiamis | H01L 21/486 |
| 2023/0197620 A1* | 6/2023 | Strong | H01L 21/486 |
| | | | 257/774 |

\* cited by examiner

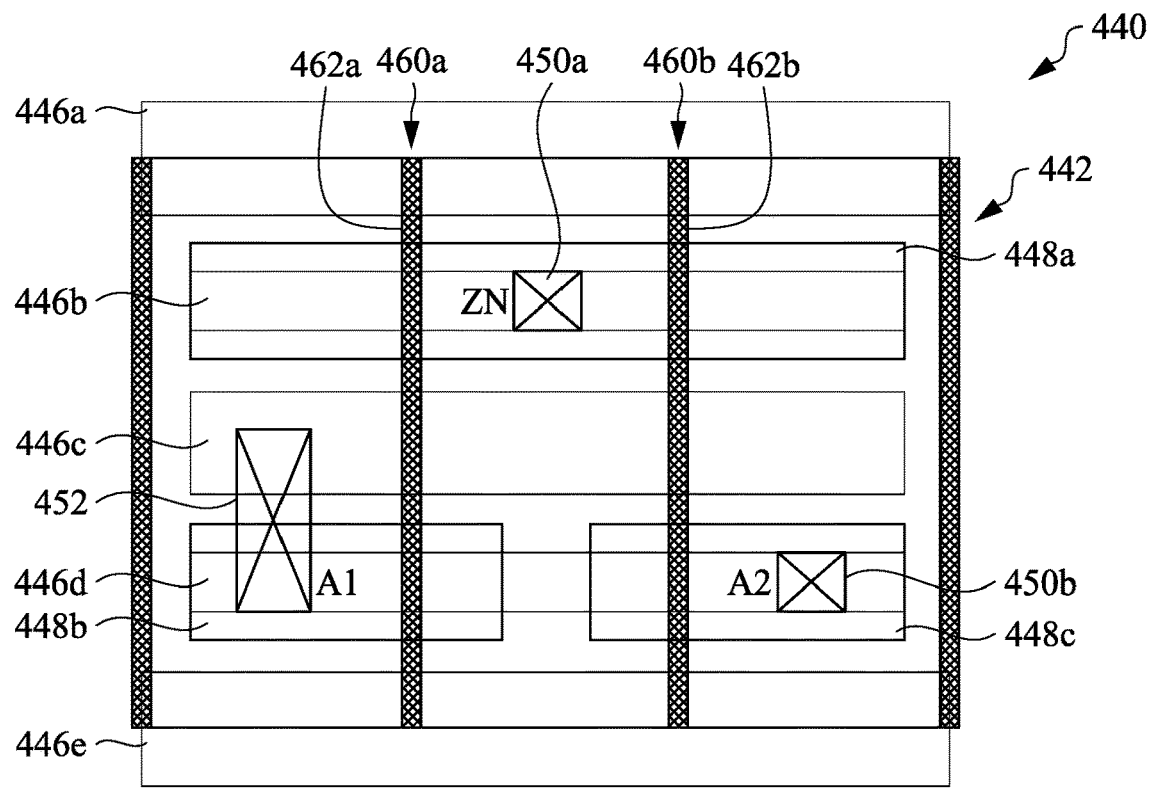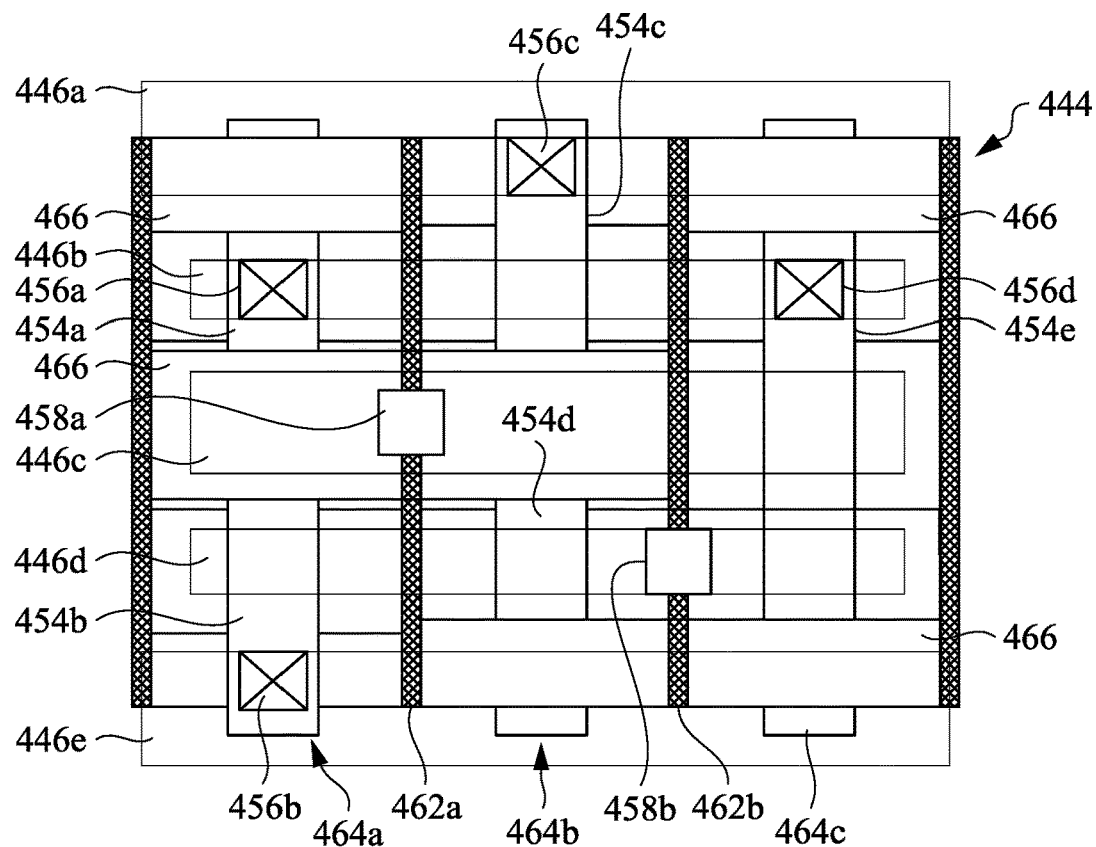
FIG. 14

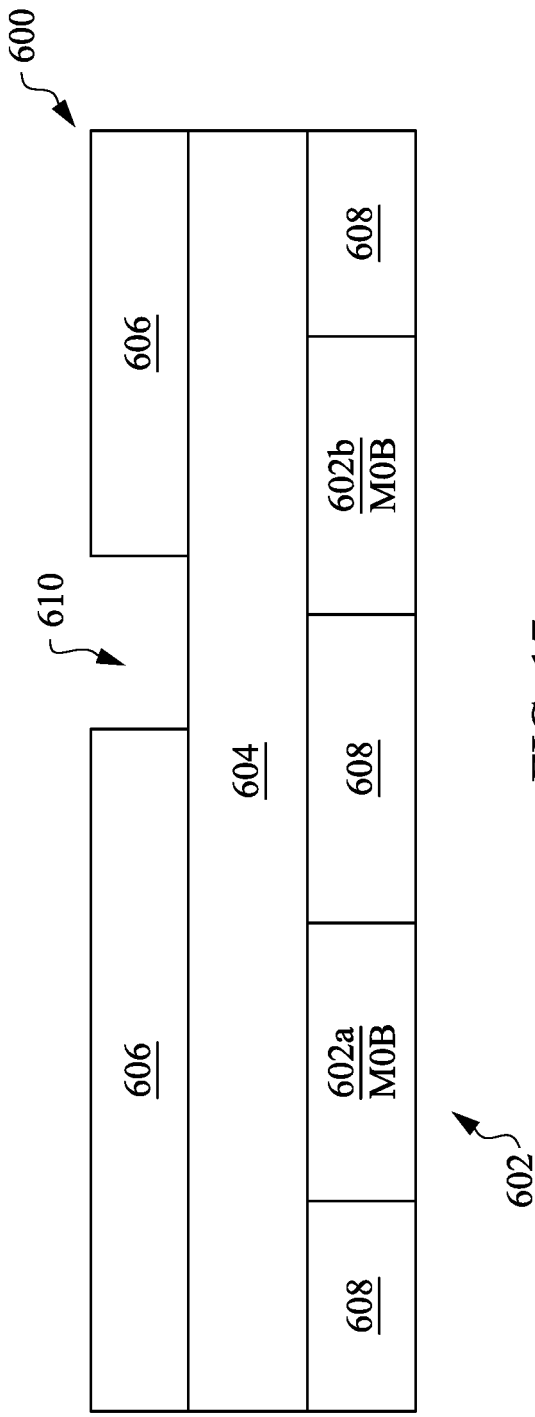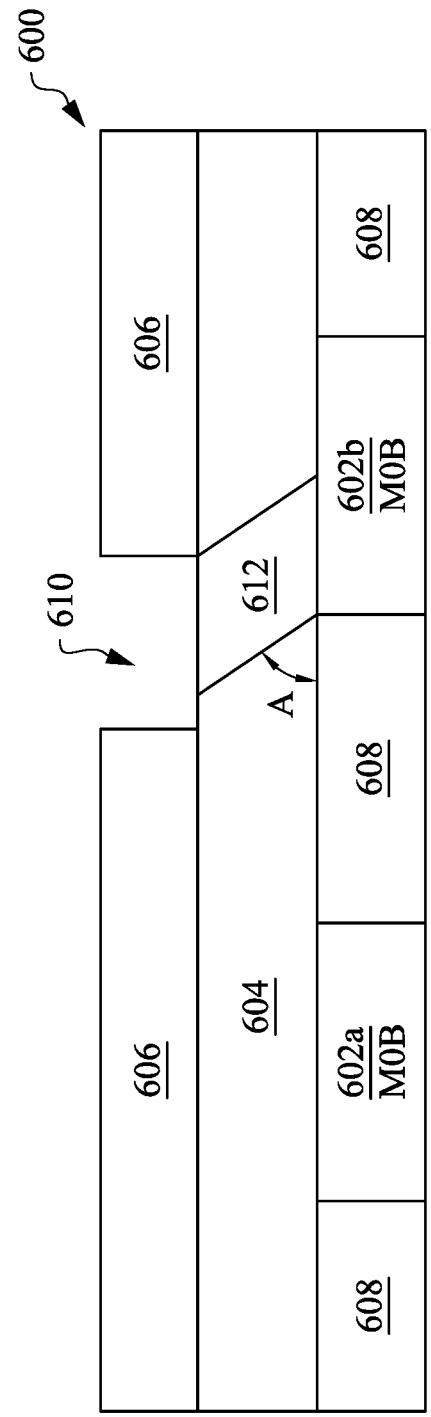
FIG. 17
FIG. 18

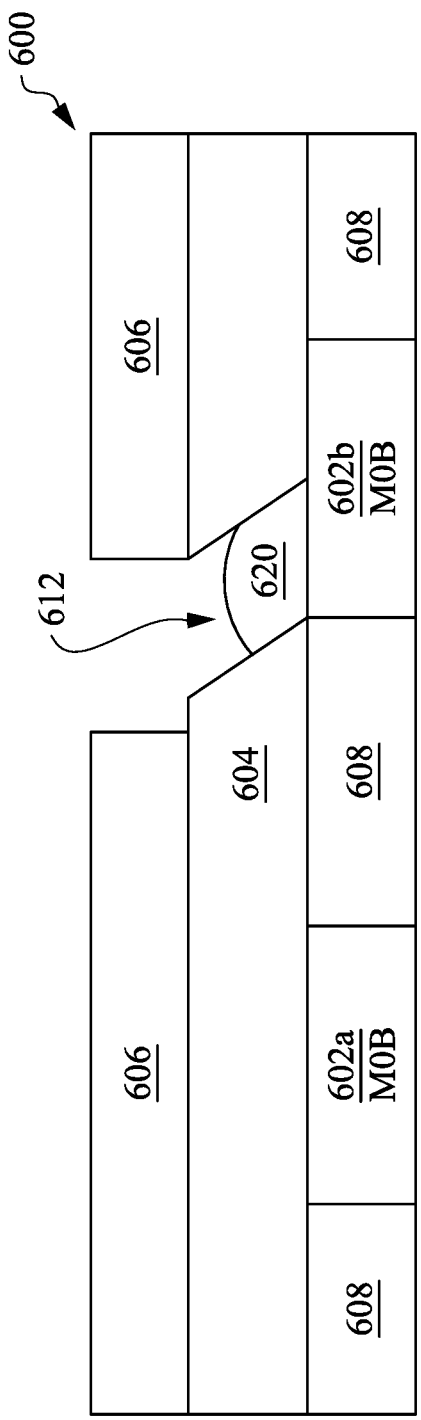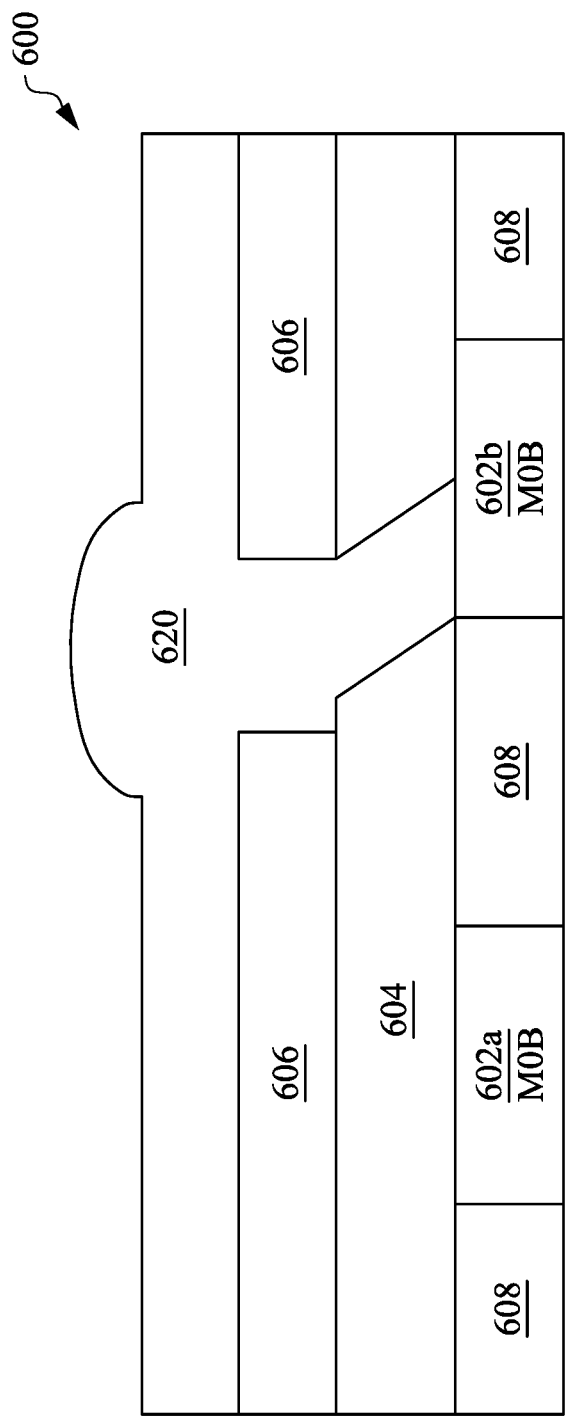

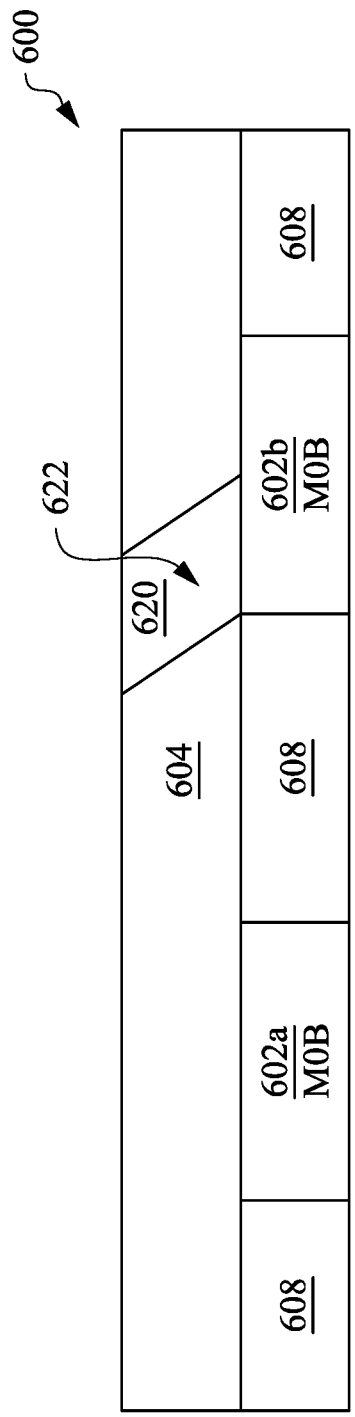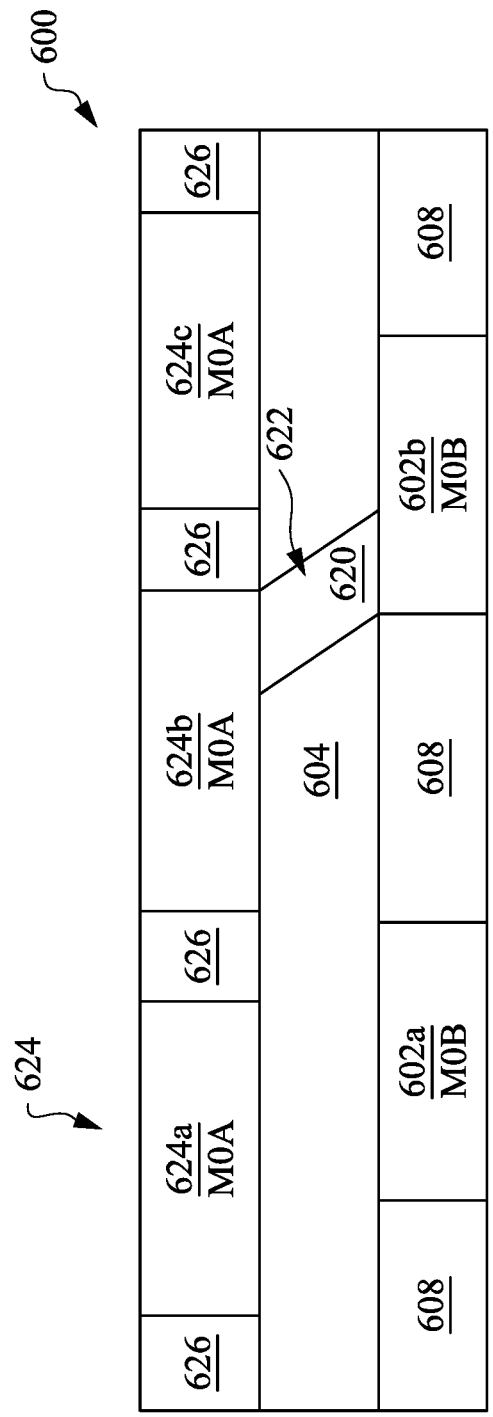

DIAGONAL VIAS IN SEMICONDUCTOR STRUCTURES

CROSS-REFERENCE TO RELATED APPLICATIONS

This application claims the benefit of U.S. Provisional Patent Application No. 63/175,326, filed on Apr. 15, 2021, the disclosure of which is incorporated by reference in its entirety.

BACKGROUND

Some semiconductor structures, such as integrated circuits, include conductive pathways or connections, referred to as vias, between the different layers of the semiconductor structures. Typically, vias are used to connect components, such as transistors, resistors, and capacitors, to other components and/or to conductive layers, such as metal layers. Also, vias are used to connect different conductive layers together, such as one metal layer to another metal layer. The conductive layers of the semiconductor structures are patterned into conductive tracks or lines that connect the components together and connect the components to input/output (I/O) devices and pads. The tracks of the conductive layers, such as the tracks of a first metal layer (M0) and the tracks of a second metal layer (M1), are limited resources in the semiconductor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 14 is a diagram schematically illustrating a layout of the nand gate logic circuit, in accordance with some embodiments.

FIG. 17 is a diagram schematically illustrating a semiconductor structure having a first conductive layer, a dielectric layer disposed over the first conductive layer, and a hard mask disposed on the dielectric layer, in accordance with some embodiments.

FIG. 18 is a diagram schematically illustrating the semiconductor structure with the dielectric layer etched away to create a diagonally etched cavity through the dielectric layer, in accordance with some embodiments.

FIG. 20 is a diagram schematically illustrating growing a conductor in the diagonally etched cavity of the dielectric layer, in accordance with some embodiments.

FIG. 21 is a diagram schematically illustrating growing the conductor in the diagonally etched cavity and through the diagonally etched cavity to above the dielectric layer, in accordance with some embodiments.

FIG. 22 is a diagram schematically illustrating the semiconductor structure including a diagonal via in the dielectric layer and electrically coupled to the conductive track, in accordance with some embodiments.

FIG. 23 is a diagram schematically illustrating a second conductive layer disposed on the dielectric layer, in accordance with some embodiments.

DETAILED DESCRIPTION

Figure 1:
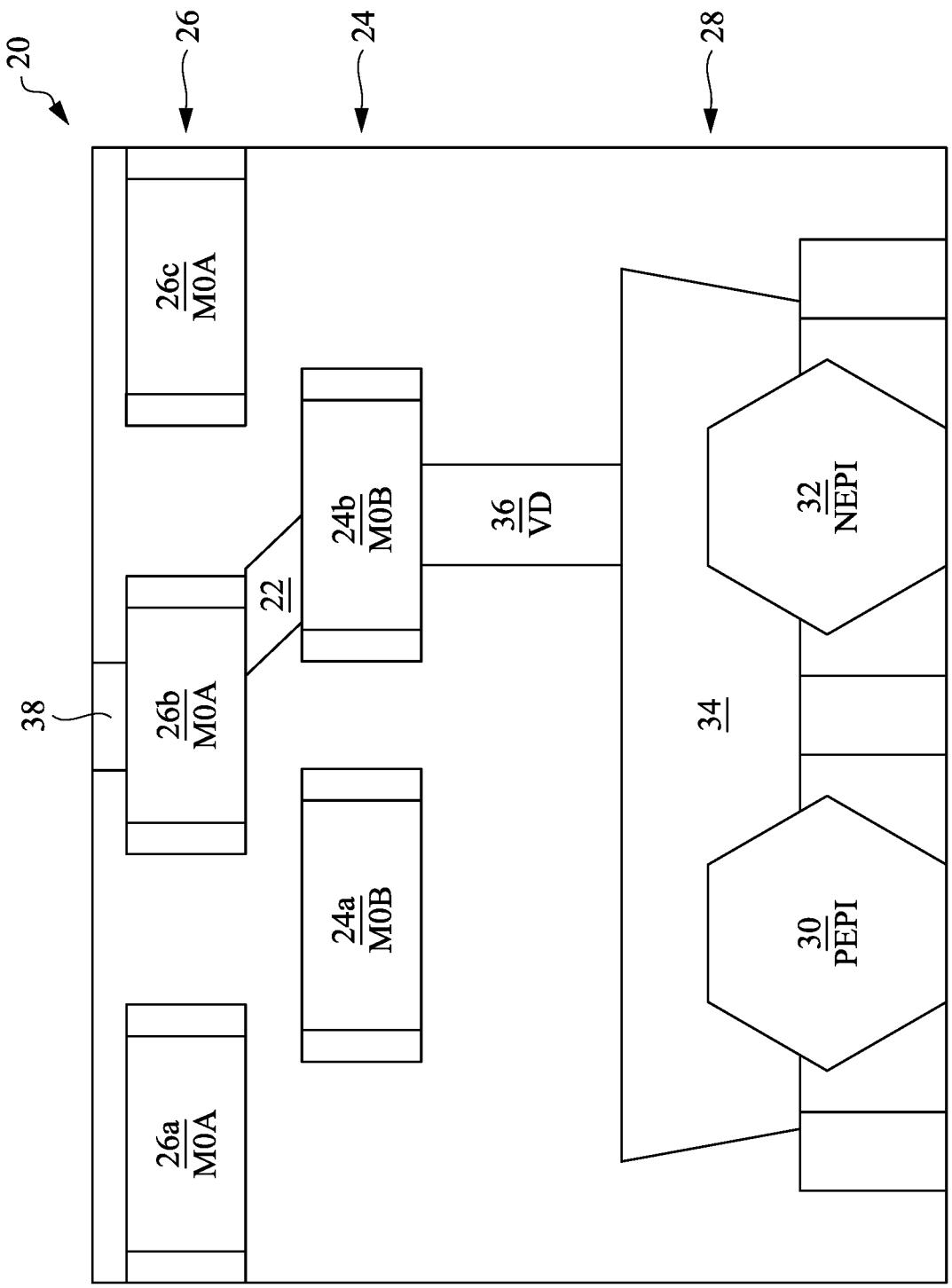
FIG. 1 is a diagram schematically illustrating a portion of an integrated circuit including a diagonal via connecting different conductive layers in the integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some semiconductor structures, such as integrated circuits, include many components that are electrically connected by tracks of conductive layers, such as tracks of metal layers, to perform the functions of the circuit. Sometimes, it is difficult to connect one or more parts of a component, such as a gate or a drain/source region of a transistor, to one of the tracks of the conductive layers and/or to connect the tracks of the different conductive layers together due to crowding or space limitation on the integrated circuit. The diagonal vias of the current disclosure solve this problem by making it possible to connect the one or more parts to tracks of conductive layers that are not directly above the component parts.

Also, in some embodiments, the track of a conductive layer to be connected to a component may be directly above the component, but the vertical distance between the track and the component may be very large. Long vias, also referred to as super vias, can be very risky. However, in this situation, the diagonal vias of the current disclosure can solve the problem by making it possible to connect the component to a track of a conductive layer that is a short vertical distance away from the component and then connect this conductive layer to the track of the conductive layer of interest using the diagonal via.

Also, in some embodiments, components are connected to a power rail by expanding a metal over diffusion (MD) (where the diffusion is an oxide diffusion that defines the active areas of a metal-oxide-semiconductor field-effect transistor (MOSFET), such as the drain, source, and gate areas of a fin field-effect transistor (FINFET)) of the component to vertically align the MD with the power rail. However, expanding the MD may shorten the distance between two MD of the component, such that there are problems in manufacturing the component. For example, the two MD may short together. The diagonal via alleviates this problem by diagonally connecting the unexpanded, smaller MD to the power rail. In some embodiments, the smaller MD is made smaller by increasing a cut MD (CMD) between the two MD, such that there is more space between the two MD, which avoids shorting.

The disclosure further describes a method of manufacturing the diagonal vias. The method includes etching a dielectric layer to provide a diagonally etched cavity through the dielectric layer and down to a first conductive layer. A conductor is grown in the diagonally etched cavity to create the diagonal via, and a second conductive layer is disposed on the via to electrically couple the two conductive layers.

The diagonal vias make it easier to connect components and conductive layers in an integrated circuit, adding connectivity to the integrated circuit. The diagonal vias alleviate demands on the limited resources of the conductive layers, such as the metal layers, of the integrated circuit.

FIG. 1 is a diagram schematically illustrating a portion of an integrated circuit 20 including a diagonal via 22 connecting two different conductive layers 24 and 26 of the integrated circuit 20, in accordance with some embodiments. The diagonal via 22 extends at a diagonal between the conductive layers 24 and 26, i.e., from one conductive layer 24 to the other conductive layer 26, to electrically couple the conductive layers 24 and 26 together. In some embodiments, the different conductive layers 24 and 26 are different metal layers in the integrated circuit 20. In some embodiments, the different conductive layers 24 and 26 are different layers of the same metal layer, such as M0. In some embodiments, the different conductive layers 24 and 26 are two different metal layers, such as M0 and M1.

The integrated circuit 20 includes a lower or bottom level first metal layer (MOB) 24 and an upper or top level first metal layer (MOA) 26. The MOB 24 includes a first track of MOB 24a and a second track of MOB 24b. The MOA 26 includes a first track of MOA 26a, a second track of MOA 26b, and a third track of MOA 26c. The tracks of MOB 24a and 24b and the tracks of MOA 26a-26c are parallel to one another and extend into and out of the page. In other embodiments, the tracks of MOB 24a and 24b can be orthogonal to the tracks of MOA 26a-26c.

The integrated circuit 20 includes components, such as component 28. The component 28 includes a p-epitaxial layer 30, an n-epitaxial layer 32, and a MD 34 over the p-epitaxial layer 30 and the n-epitaxial layer 32. A via over diffusion (VD) 36 electrically connects the MD 34 to MOB 24b. The diagonal via 22 electrically connects the MOB 24b to the MOA 26b. A further via 38 connects the MOA 26b to other components in the integrated circuit 20. In some embodiments, component 28 is a FINFET.

Figure 2:
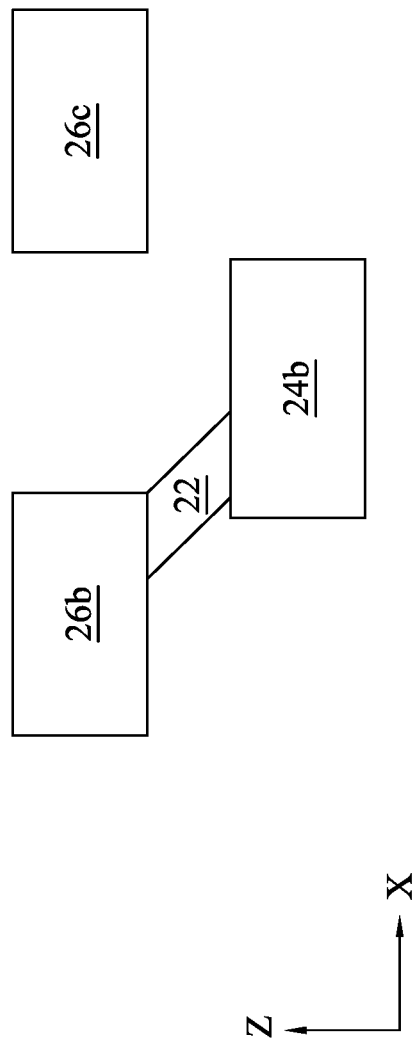
FIG. 2 is a side-view diagram schematically illustrating MOB electrically connected to MOA by the diagonal via, in accordance with some embodiments.
Figure 3:
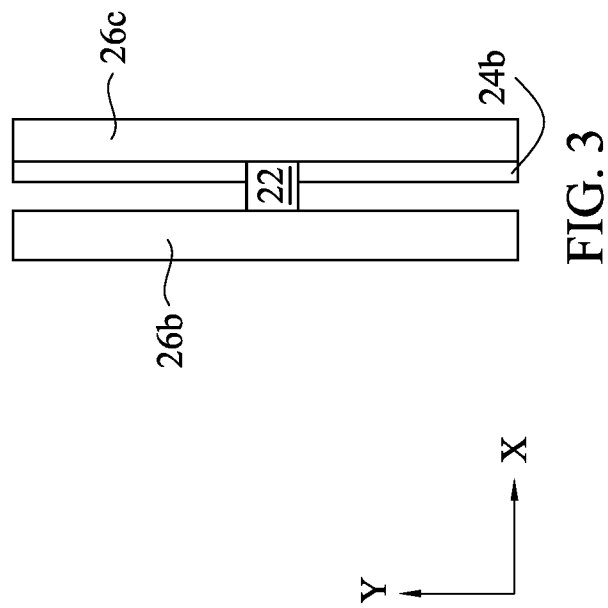
FIG. 3 is a top-view diagram schematically illustrating MOB electrically connected to MOA by the diagonal via, in accordance with some embodiments.

FIG. 2 is a side-view diagram schematically illustrating MOB 24b electrically connected to MOA 26b by the diagonal via 22, in accordance with some embodiments, and FIG. 3 is a top-view diagram schematically illustrating MOB 24b electrically connected to MOA 26b by the diagonal via 22, in accordance with some embodiments.

The side-view diagram of FIG. 2 is of the X-Z plane, taken along the Y-axis that is in and out of the page. The track of MOB 24b and the tracks of MOA 26b and MOA 26c are parallel to one another and extend into and out of the page.

The top-view diagram of FIG. 3 is of the X-Y plane, taken along the Z-axis. The track of MOB 24b and the tracks of MOA 26b and MOA 26c are parallel to one another along the Y-axis. Also, as illustrated, the track of MOA 26c partially overlaps the track of MOB 24b.

The diagonal via 22 extends from MOB 24b to MOA 26b to electrically connect MOB 24b to MOA 26b.

Figure 4:
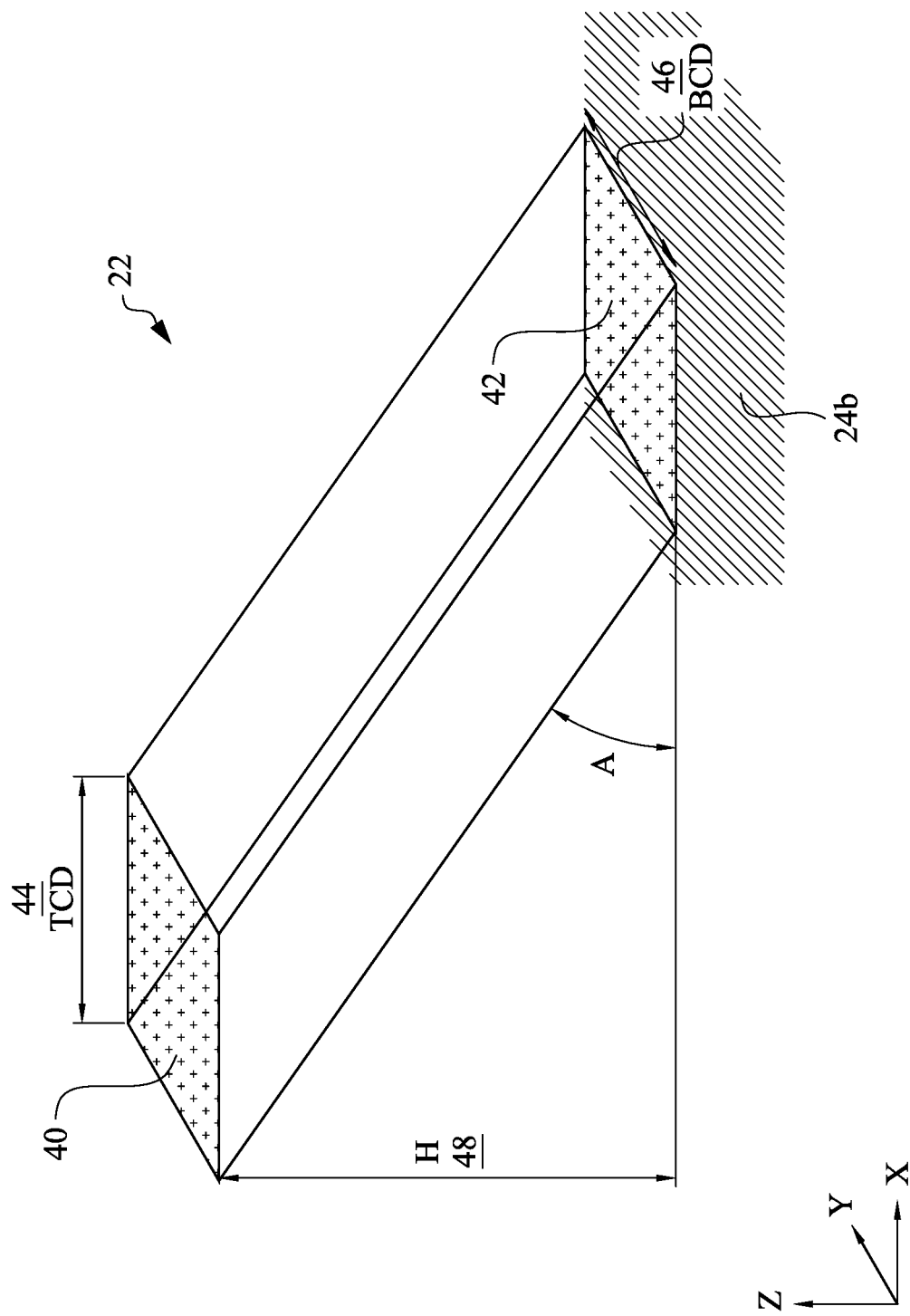
FIG. 4 is a diagram schematically illustrating the diagonal via, in accordance with some embodiments.

FIG. 4 is a diagram schematically illustrating the diagonal via 22, in accordance with some embodiments. The diagonal via 22 includes a top portion 40, which would be or is electrically connected to MOA 26b, and a bottom portion 42 electrically coupled to MOB 24b. In some embodiments, the top portion 40 is square and, in some embodiments, the bottom portion 42 is square. Other shapes for one or more of the top portion 40 and the bottom portion 42 are within the scope of the disclosure, such as circular, triangular, rectangular, ellipsoidal, rhomboidal, trapezoidal, hexagonal, octagonal or other suitable shapes.

The top portion 40 includes a top critical dimension (TCD) 44 and the bottom portion 42 includes a bottom critical dimension (BCD) 46. In some embodiments, the TCD 44 is in a range from 10 nanometers (nm) to 50 nm. In some embodiments, the BCD 46 is in a range from 5 nm to 50 nm. Other range values for the TCD 44 and the BCD 46 are within the scope of this disclosure. In general, the TCD 44 and the BCD 46 are determined to allow the desired electrical connections between the top portion 42 and bottom portion 44 based on their relative vertical and horizontal positions and the manufacturing processes employed to create the various structures (discussed further herein below.)

The diagonal via 22 extends from the bottom portion 42 to the top portion 40 at an angle A from the top of the MOB 24b and the X-axis. In some embodiments, the angle A is in a range from 30 degrees to 45 degrees. Also, the diagonal via 22 has an aspect ratio, which is the TCD 44 divided by the vertical distance or height H 48 from the top portion 40 to the bottom portion 42. In some embodiments, the aspect ratio is in a range from 0.5 to 2.0. Other range values for the angle A and the aspect ratio are within the scope of this disclosure. For example, it has been found that an angle A down to 30 degrees provides a suitable connection between the top portion 42 and the bottom portion 42. Also, in general, the aspect ratio is determined to allow the desired electrical connections between the top portion 42 and the bottom portion 42 based on their relative vertical and horizontal positions and the manufacturing processes employed to create the various structures (discussed further herein below.)

Figure 5:
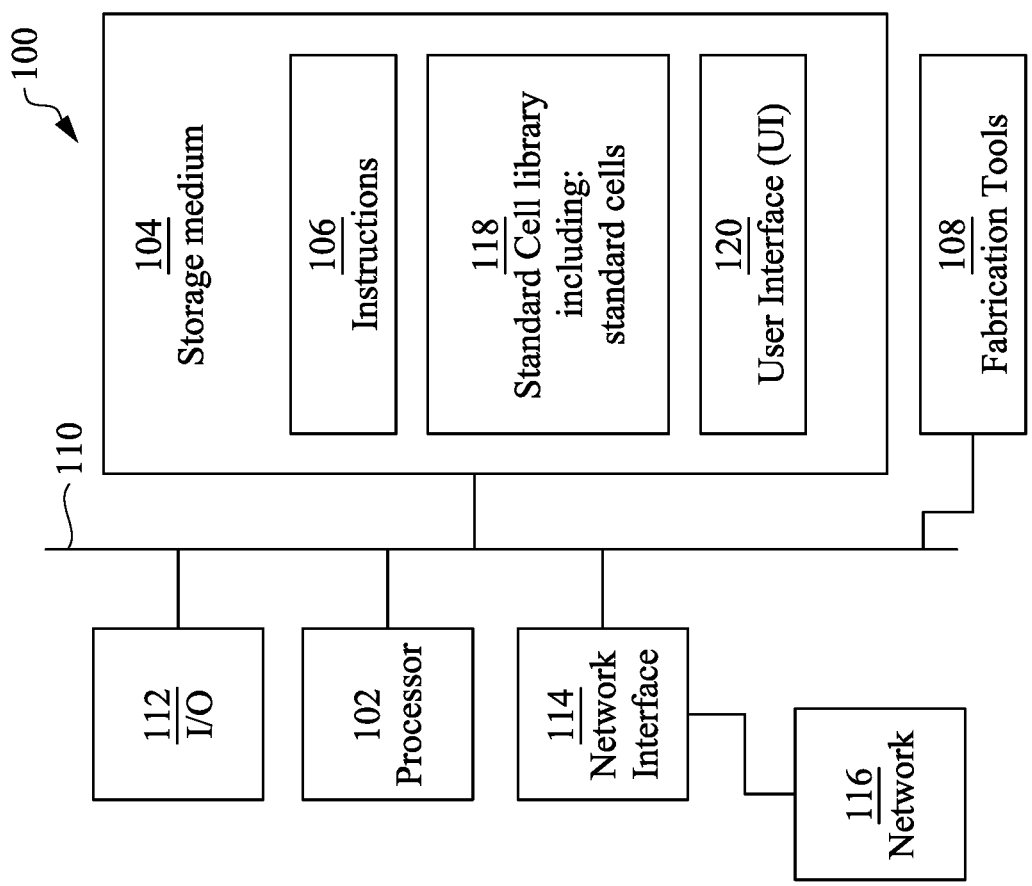
FIG. 5 is a block diagram illustrating an example of a computer system configured to design and manufacture the diagonal vias and circuits of this disclosure, in accordance with some embodiments.

Some or all the design and manufacture of the diagonal vias 22 and circuits described herein can be performed by or with a computer system, such as an EDA system. FIG. 5 is a block diagram illustrating various aspects of an EDA system 100 configured to be used to perform some or all the design and manufacture of the diagonal vias 22 and circuits described herein, in accordance with the present disclosure.

In some embodiments, the EDA system 100 includes an automated place and route (APR) system. In some embodiments, the EDA system 100 is a general-purpose computing device including a processor 102 and a non-transitory, computer-readable storage medium 104. The computer-readable storage medium 104 may be encoded with, e.g., store, computer program code such as a set of executable instructions 106. Execution of the instructions 106 by the processor 102 represents (at least in part) an EDA tool that implements a portion or all the functions of the system 100, such as providing layouts for manufacturing diagonal vias in the circuits described herein. Further, fabrication tools 108 are included to layout and physically implement the design and manufacture of the layouts.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all of the functions of the system 100, such as providing layouts for the manufacture of diagonal vias in the circuit described herein and other functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer-readable storage medium 104 can include a compact disk, read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all of the functions of the system 100, such as design and manufacture of diagonal vias and circuits that include diagonal vias and other functions of the system 100. In some embodiments, the computer-readable storage medium 104 also stores information which facilitates performing a portion or all the functions of the system 100. In some embodiments, the computer-readable storage medium 104 stores a standard cell library 118 that includes standard logic cells.

The EDA system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of standard cells, and/or other parameters for processing by processor 102. The information is transferred to the processor 102 by the bus 110. Also, the EDA system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the EDA system 100. In some embodiments, a layout diagram which includes standard cells is generated using a tool such as VIRTUOSO available from CADENCE DESIGN SYSTEMS, Inc., or another suitable layout generating tool.

In some embodiments, the layouts and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a DVD, a magnetic disk such as a hard disk, a semiconductor memory such as a ROM and RAM, and a memory card, and the like.

As noted above, embodiments of the EDA system 100 include fabrication tools 108 for implementing the manufacturing processes of the system 100. For example, a synthesis may be performed on a design in which the behavior and/or functions desired from the design are transformed to a functionally equivalent logic gate-level circuit description by matching the design to standard cells selected from the standard cell library 118. This synthesis results in a functionally equivalent logic gate-level circuit description, such as a gate-level netlist. Based on the gate-level netlist, a photolithographic mask may be generated that is used to fabricate the IC by the fabrication tools 108.

Figure 6:
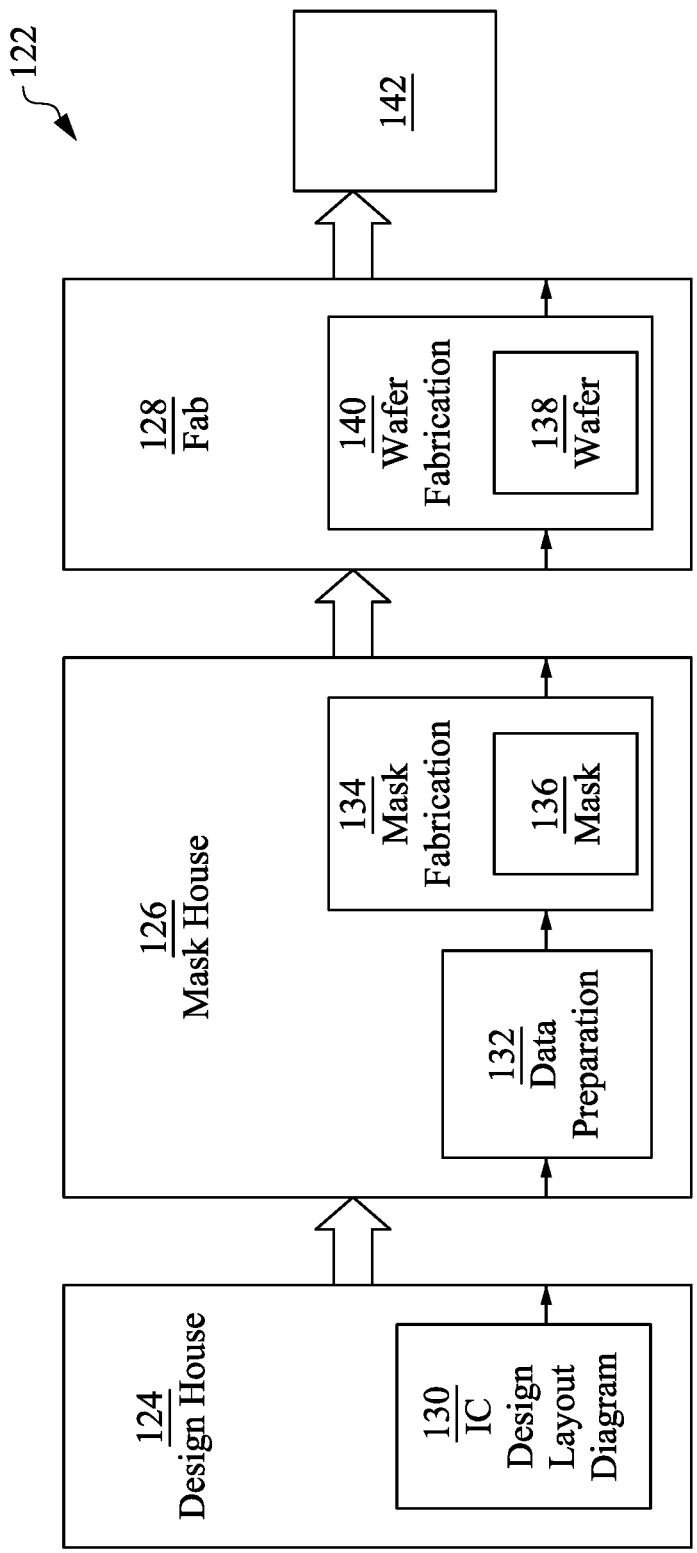
FIG. 6 is a block diagram of an integrated circuit (IC) manufacturing system and an IC manufacturing flow associated therewith, in accordance with some embodiments.

Further aspects of device fabrication are disclosed in conjunction with FIG. 6, which is a block diagram of an IC manufacturing system 122 and an IC manufacturing flow associated therewith, in accordance with some embodiments. In some embodiments, based on a layout diagram, one or more semiconductor masks and/or at least one component in a layer of a semiconductor IC is fabricated using the manufacturing system 122.

In FIG. 6, the IC manufacturing system 122 includes entities, such as a design house 124, a mask house 126, and an IC manufacturer/fabricator ("fab") 128, that interact with one another in the design, development, and manufacturing cycles and/or services related to manufacturing an IC, such as the circuits described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the IC fab 128 are owned by a single larger company. In some embodiments, two or more of the design house 124, the mask house 126, and the IC fab 128 coexist in a common facility and use common resources.

The design house (or design team) 124 generates an IC design layout diagram 130. The IC design layout diagram 130 includes various geometrical patterns, or IC layout diagrams designed for an IC device, such as the devices that include diagonal vias and circuits described herein. The geometrical patterns correspond to patterns of metal, oxide, or semiconductor layers that make up the various components of the semiconductor structures to be fabricated. The various layers combine to form various IC features. For example, a portion of the IC design layout diagram 130 includes various IC features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form an IC design layout diagram 130. The design procedure includes one or more of analog circuit design, digital logic circuit design, physical layout designs, and place and route routines. The IC design layout diagram 130 is presented in one or more data files having information of the geometrical patterns. For example, IC design layout diagram 130 can be expressed in a GDSII file format or DFII file format.

The mask house 126 includes data preparation 132 and mask fabrication 134. The mask house 126 uses the IC design layout diagram 130 to manufacture one or more masks 136 to be used for fabricating the various layers of the IC or semiconductor structure. The mask house 126 performs mask data preparation 132, where the IC design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the IC fab 128. In FIG. 6, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the IC design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the IC design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the IC fab 128. LPC simulates this processing based on the IC design layout diagram 130 to create a simulated manufactured device. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 130.

The above description of mask data preparation 132 has been simplified for the purposes of clarity. In some embodiments, data preparation 132 includes additional features such as a logic operation (LOP) to modify the IC design layout diagram 130 according to manufacturing rules. Additionally, the processes applied to the IC design layout diagram 130 during data preparation 132 may be executed in a variety of different orders.

After the mask data preparation 132 and during the mask fabrication 134, a mask 136 or a group of masks 136 are fabricated based on the modified IC design layout diagram 130. In some embodiments, the mask fabrication 134 includes performing one or more lithographic exposures based on the IC design layout diagram 130. In some embodiments, an electron-beam (e-beam) or a mechanism of multiple e-beams is used to form a pattern on a mask (photomask or reticle) 136 based on the modified IC design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

The IC fab 128 includes wafer fabrication 140. The IC fab 128 is an IC fabrication business that includes one or more manufacturing facilities for the fabrication of a variety of different IC products. In some embodiments, the IC fab 128 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 128 uses the mask(s) 136 fabricated by the mask house 126 to fabricate the semiconductor structures or ICs 142 of the current disclosure. Thus, the IC fab 128 at least indirectly uses the IC design layout diagram 130 to fabricate the semiconductor structures or ICs 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the IC fab 128 using the mask(s) 136 to form the semiconductor structures or ICs 142 of the current disclosure. In some embodiments, the IC fabrication includes performing one or more lithographic exposures based at least indirectly on the IC design layout diagram 130.

In some embodiments, the EDA system 100 and the IC manufacturing system 122 are configured to design and manufacture the integrated circuit 20 and the diagonal vias 22. In addition, in some embodiments, the diagonal vias 22 are designed into circuits, such as analog circuits, digital circuits, and mixed analog and digital circuits.

Figure 7:
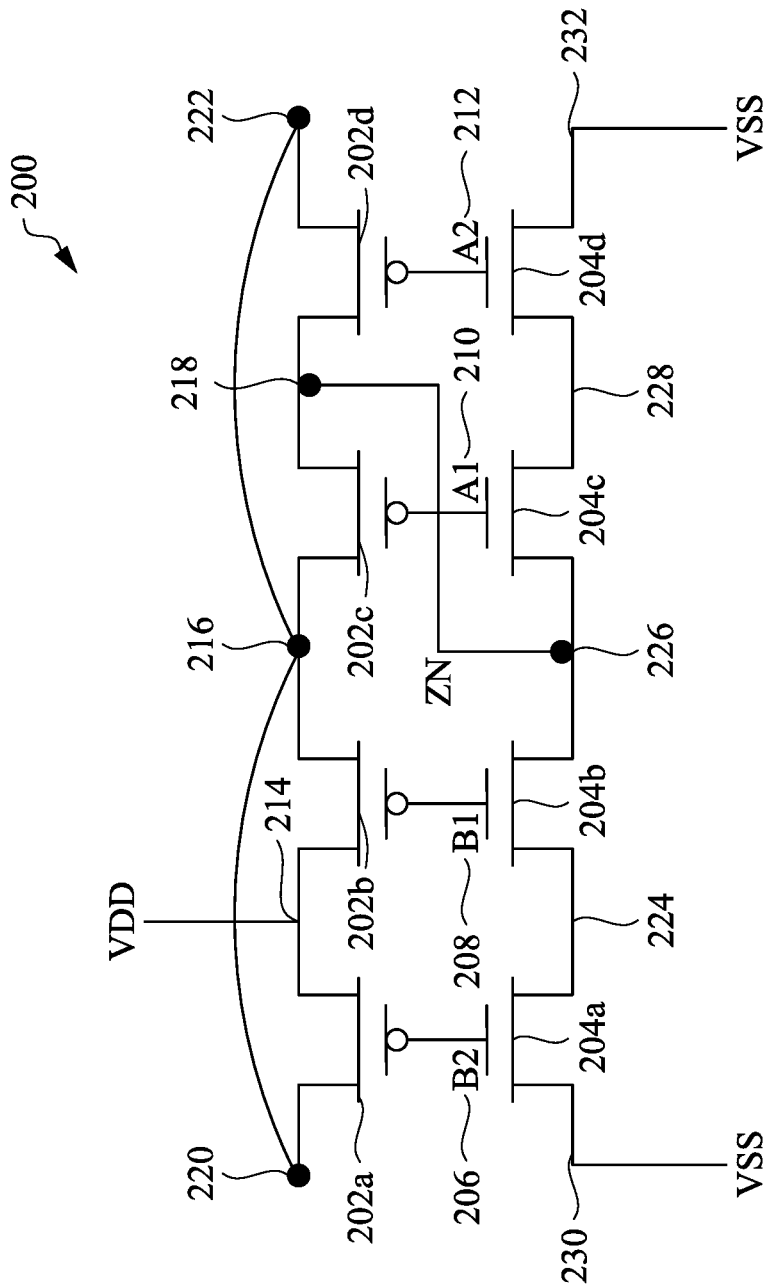
FIG. 7 is a diagram schematically illustrating an and-or-invert (AOI) logic circuit, in accordance with some embodiments.

FIG. 7 is a diagram schematically illustrating an AOI logic circuit 200, which includes one or more diagonal vias such as the diagonal vias 22 discussed above, in accordance with some embodiments. Example layout diagrams for the AOI logic circuit 200 including such diagonal vias are shown in FIGS. 8-12. The AOI logic circuit 200 is an AOI22D1 logic circuit having four inputs A1, A2, B1, and B2 and one output ZN with a driving strength of 1. The AOI logic circuit 200 includes two 2-input "and" functions, followed by an "or" function, and then an "invert" function. One "and" function includes first inputs A1 and A2 and the other "and" function includes second inputs B1 and B2.

The AOI logic circuit 200 includes eight MOSFETs, four PMOS transistors 202a-202d and four NMOS transistors 204a-204d. The gate of PMOS transistor 202a is electrically coupled to the gate of NMOS transistor 204a at input B2 206, the gate of PMOS transistor 202b is electrically coupled to the gate of NMOS transistor 204b at input B1 208, the gate of PMOS transistor 202c is electrically coupled to the gate of NMOS transistor 204c at input A1 210, and the gate of PMOS transistor 202d is electrically coupled to the gate of NMOS transistor 204d at input A2 212.

The drain/source paths of the PMOS transistors 202a-202d are electrically coupled together. One side of the drain/source path of PMOS transistor 202a is electrically coupled to one side of the drain/source path of PMOS transistor 202b and to power, such as VDD, at 214. The other side of the drain/source path of PMOS transistor 202b is electrically coupled to one side of the drain/source path of PMOS transistor 202c at 216. Also, the other side of the drain/source path of PMOS transistor 202c is electrically coupled to one side of the drain/source path of PMOS transistor 202d at 218. In addition, the other side of the drain/source path of PMOS transistor 202a at 220 is electrically coupled to the drain/source paths of PMOS transistors 202b and 202c at 216 and to the other side of the drain/source path of PMOS transistor 202d at 222.

The drain/source paths of the NMOS transistors 204a-204d are also electrically coupled together. One side of the drain/source path of NMOS transistor 204a is electrically coupled to one side of the drain/source path of NMOS transistor 204b at 224. The other side of the drain/source path of NMOS transistor 204b is electrically coupled to one side of the drain/source path of NMOS transistor 204c at 226. Also, the other side of the drain/source path of NMOS transistor 204c is electrically coupled to one side of the drain/source path of NMOS transistor 204d at 228. In addition, the other side of the drain/source path of NMOS transistor 204a is electrically coupled to a reference, such as VSS, at 230 and the other side of the drain/source path of NMOS transistor 204d is electrically coupled to a reference, such as VSS, at 232.

The drain/source path between PMOS transistors 202c and 202d at 218 is electrically coupled to the drain/source paths between NMOS transistors 204b and 204c at 226, which is the output ZN.

Figure 8:
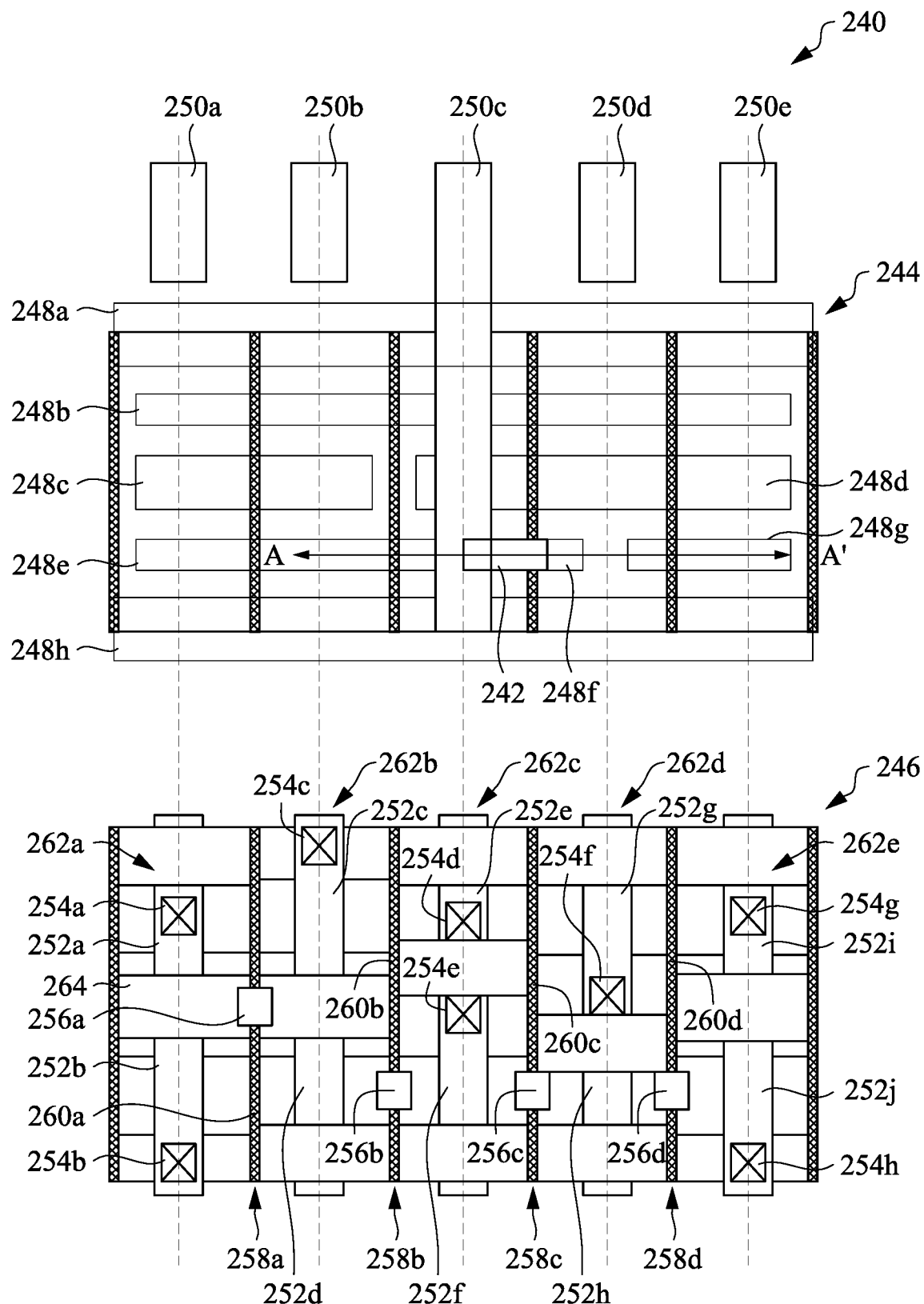
FIG. 8 is a diagram schematically illustrating a layout of the AOI logic circuit, which includes a diagonal via, in accordance with some embodiments.

FIG. 8 is a diagram schematically illustrating a layout 240 of the AOI logic circuit 200, which includes a diagonal via 242, in accordance with some embodiments. The layout 240 includes an upper level layout portion 244 and a lower level layout portion 246.

The upper level layout portion 244 includes M0 tracks 248a-248h and M1 tracks 250a-250e. The lower level layout portion 246 includes MDs 252a-252j, VDs 254a-254h, and via over gate contacts (VG) 256a-256d. In some embodiments, each of the M0 tracks 248a-248h is orthogonal to each of the M1 tracks 250a-250e.

The AOI logic circuit 200, including the four PMOS transistors 202a-202d and the four NMOS transistors 204a-204d, is laid out in the layout 240. The four PMOS transistors 202a-202d and the four NMOS transistors 204a-204d are laid out as four pairs of complementary-metal-oxide-semiconductor (CMOS) transistors. A first pair of transistors 258a includes PMOS transistor 202a and NMOS transistor 204a, a second pair of transistors 258b includes PMOS transistor 202b and NMOS transistor 204b, a third pair of transistors 258c includes PMOS transistor 202c and NMOS transistor 204c, and a fourth pair of transistors 258d includes PMOS transistor 202d and NMOS transistor 204d. The four pairs of transistors 258a-258d are laid out from left to right in the upper and lower level layout portions 242 and 244.

The four pairs of transistors 258a-258d include gates 260a-260d and drain/source regions 262a-262e on each side of the gates 260a-260d. The drain/source regions 262a-262e include CMD 264 that define the MDs 252a-252j. The gates 260a-260d correspond to the inputs B2 at 206, B1 at 208, A1 at 210, and A2 at 212, respectively. In some embodiments, each of the M1 tracks 250a-250e aligns with one of the drain/source regions 262a-262e.

The gate 260a is electrically coupled to M0 248c by VG 256a for input B2 at 206, the gate 260b is electrically coupled to M0 248e by VG 256b for input B1 at 208, the gate 260c is electrically coupled to M0 248f by VG 256c for input A1 at 210, and the gate 260d is electrically coupled to M0 248g by VG 256d for input A2 at 212.

Also, MD 252a corresponds to the drain/source path at 220 of PMOS transistor 202a and is electrically coupled to M0 248b by VD 254a, MD 252e corresponds to the drain/source path at 216 of PMOS transistors 202b and 202c and is electrically coupled to M0 248b by VD 254d, and MD 252i corresponds to the drain/source path at 222 of PMOS transistor 202d and is electrically coupled to M0 248b by VD 254g. Further, MD 252f corresponds to the drain/source path at 226 of NMOS transistors 204b and 204c and is electrically coupled to M0 248d by VD 254e, and MD 252g corresponds to the drain/source path at 218 of PMOS transistors 202c and 202d and is electrically coupled to M0 248d by VD 254f to form the output ZN.

For power, MD 252c corresponds to the drain/source path at 214 of PMOS transistors 202a and 202b and is electrically coupled to M0 248a by VD 254c, which is for power, such as VDD. Also, for a reference, MD 252b corresponds to the drain/source path at 230 of NMOS transistor 204a and is electrically coupled to M0 248h by VD 254b, and MD 252j corresponds to the drain/source path at 232 of NMOS transistor 204d and is electrically coupled to M0 248h by VD 254h, which is for the reference, such as VSS.

In this layout 240, each of M0 248a-248h can be connected by a vertical via to at least one of the M1 tracks 250a-250e, except M0 248f, which is a shorter M0 track and not in line with any of the M1 tracks 250a-250e. Thus, diagonal via 242 is used to connect M0 248f to M1 250c.

Figure 9:
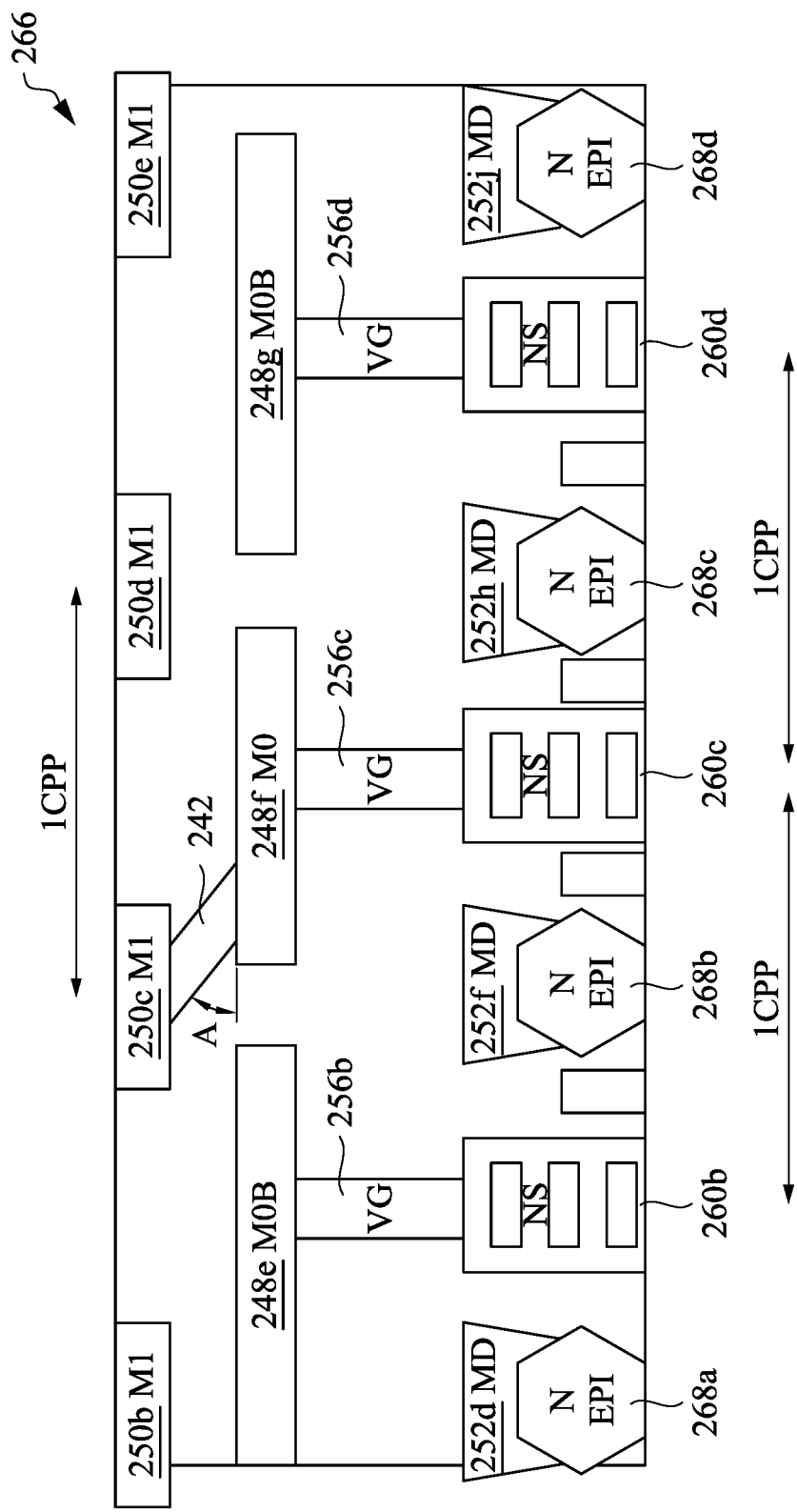
FIG. 9 is a diagram schematically illustrating a cross-section of the layout taken along the line A-A' in FIG. 8, in accordance with some embodiments.

FIG. 9 is a diagram schematically illustrating a cross-section 266 of the layout 240 taken along the line A-A' in FIG. 8, in accordance with some embodiments. The cross-section 266 includes the diagonal via 242 electrically connecting M0 248f and M1 250c. In some embodiments, the diagonal via 242 extends at an angle A from M0 248f in a range from 30 degrees to 45 degrees to electrically couple M0 248f and M1 250c together. In some embodiments, the diagonal via 242 extends at the angle A from M0 248f to electrically couple M0 248f and M1 250c together. Other ranges for the angle A are within the scope of the disclosure. In general, angle A may be determined to provide the desired connection between M0 248f and M1 250c based on the relative vertical locations (i.e., lateral displacement) thereof and the horizontal space therebetween.

The cross-section 266 includes M1 250b-250e, M0 248e-248g, and three VGs 256b-256d. The three VGs 256b-256d are aligned on the same row. The distance between each of the M1 250b-250e is 1 contact polycrystalline silicon pitch (CPP). The distance between each of the VGs 256b-256d is 1 CPP, and the length of M0 348f is 1 CPP. The M0 248e-248g are orthogonal to the M1 250b-250e, such that the length of each M0 248e-248g extends from left to right and the length of each M1 250b-250e extends into and out of the page.

The cross-section 266 further includes the NMOS transistors 204b-204d including the gates 260b-260d and the MDs 252d, 252f, 252h, and 252j. Each of the MDs 252d, 252f, 252h, and 252j is on one of the N epitaxial regions 268a-268d, respectively. Also, the gates 260b-260d are electrically coupled to the M0 248e-248g by the VGs 256b-256d, respectively. The distance between each of the gates 260b-260d is 1 CPP. Also, M1 250b-250e align with the MDs 252d, 252f, 252h, and 252j, respectively, with a 1 CPP pitch between each of the MDs 252d, 252f, 252h, and 252j.

With the VGs 256b-256d in the same row and M0 248f 1 CPP long and with M0 248f situated between M1 250c and M1 250d, contacting M0 248f becomes difficult. The diagonal via 242 solves this problem by extending at a diagonal between M0 248f and M1 250c to electrically couple M0 248f and M1 250c together.

Figure 10:
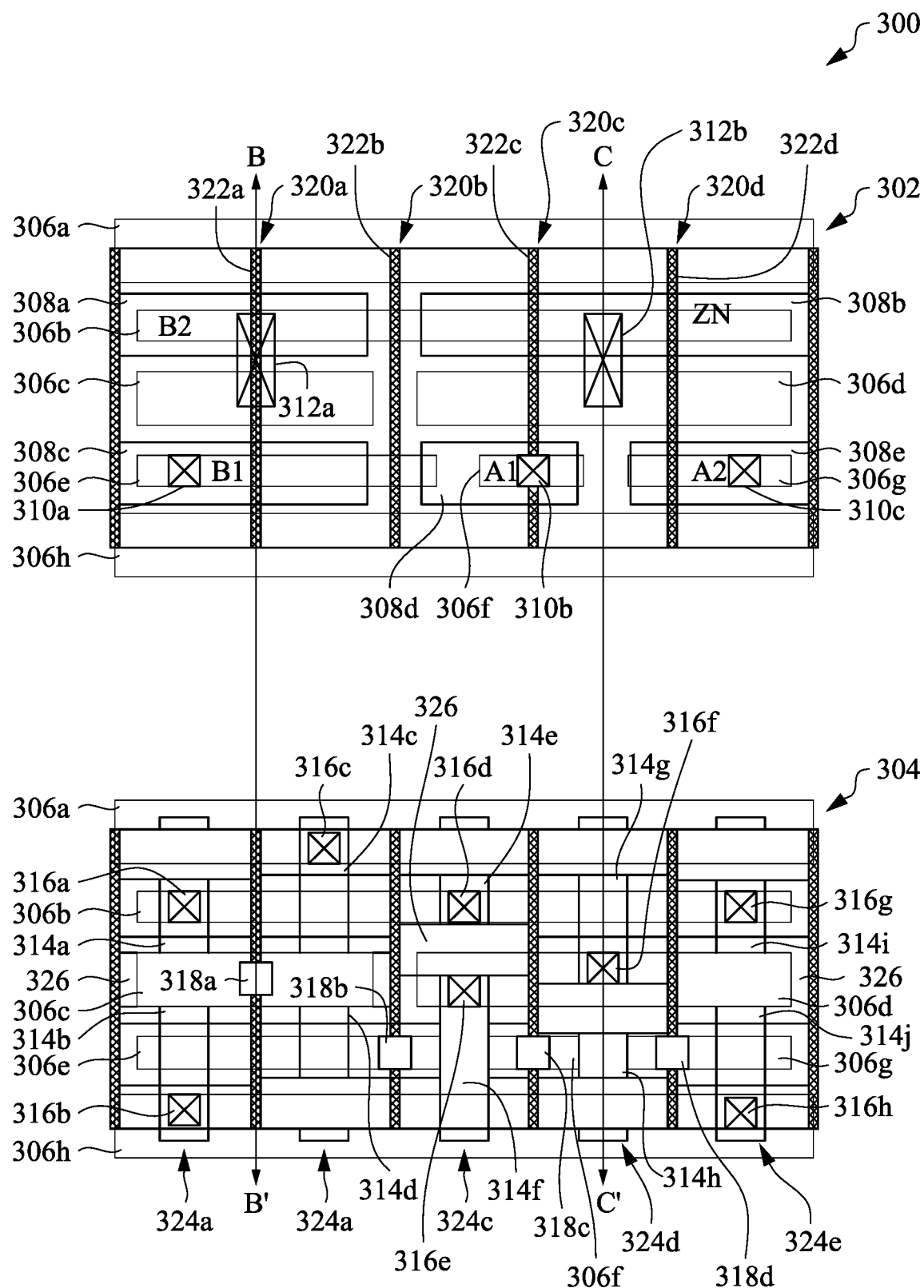
FIG. 10 is a diagram schematically illustrating a different layout of the AOI logic circuit, in accordance with some embodiments.

FIG. 10 is a diagram schematically illustrating a different layout 300 of the AOI logic circuit 200, in accordance with some embodiments. The layout 300 includes an upper level layout portion 302 and a lower level layout portion 304. In some embodiments, layout 300 is referred to as a stagger height cell structure.

The upper level layout portion 302 includes a lower or bottom first metal layer MOB 306a-306h, an upper or top first metal layer MOA 308a-308e, three vertical vias 310a-310c, and two diagonal vias 312a and 312b. The lower level layout portion 304 includes MDs 314a-314j, VDs 316a-316h, and VGs 318a-318d. Each of the MOB 306a-306h is parallel to each of the MOA 308a-308e. In some embodiments, the length of a small track of MOB, such as MOB 306f, is from 0.5 to 1.0 CPP in length from left to right in FIG. 10. In some embodiments, the MOB pitch is less than the MOA pitch.

The layout 300 includes the AOI logic circuit 200, including the four PMOS transistors 202a-202d and the four NMOS transistors 204a-204d. The four PMOS transistors 202a-202d and the four NMOS transistors 204a-204d are laid out as four pairs of complementary-metal-oxide-semiconductor (CMOS) transistors. A first pair of transistors 320a includes PMOS transistor 202a and NMOS transistor 204a, a second pair of transistors 320b includes PMOS transistor 202b and NMOS transistor 204b, a third pair of transistors 320c includes PMOS transistor 202c and NMOS transistor 204c, and a fourth pair of transistors 320d includes PMOS transistor 202d and NMOS transistor 204d. The four pairs of transistors 320a-320d are laid out from left to right in the upper and lower level layout portions 302 and 304.

The four pairs of transistors 320a-320d include gates 322a-322d and drain/source regions 324a-324e on each side of the gates 322a-322d. The drain/source regions 324a-324e include CMD 326 that define the MDs 314a-314j. The gates 322a-322d correspond to the inputs B2 at 206, B1 at 208, A1 at 210, and A2 at 212, respectively.

The gate 322a is electrically coupled to MOB 306c by VG 318a for input B2 at 206, the gate 322b is electrically coupled to MOB 306e by VG 318b for input B1 at 208, the gate 322c is electrically coupled to MOB 306f by VG 318c for input A1 at 210, and the gate 322d is electrically coupled to MOB 306g by VG 318d for input A2 at 212.

Also, MD 314a corresponds to the drain/source path at 220 of PMOS transistor 202a and is electrically coupled to MOB 306b by VD 316a, MD 314e corresponds to the drain/source path at 216 of PMOS transistors 202b and 202c and is electrically coupled to MOB 306b by VD 316d, and MD 314i corresponds to the drain/source path at 222 of PMOS transistor 202d and is electrically coupled to MOB 306b by VD 316g. Further, MD 314f corresponds to the drain/source path at 226 of NMOS transistors 204b and 204c and is electrically coupled to MOB 306d by VD 316e, and MD 314g corresponds to the drain/source path at 218 of PMOS transistors 202c and 202d and is electrically coupled to MOB 306d by VD 316f to form the output ZN.

For power, MD 314c corresponds to the drain/source path at 214 of PMOS transistors 202a and 202b and is electrically coupled to MOB 306a by VD 316c, which is for power, such as VDD. Also, for a reference, MD 314b corresponds to the drain/source path at 230 of NMOS transistor 204a and is electrically coupled to MOB 306h by VD 316b, and MD 314j corresponds to the drain/source path at 232 of NMOS transistor 204d and is electrically coupled to MOB 306h by VD 316h, which is for the reference, such as VSS.

In this layout 300, tracks of MOB 306a-306h are electrically connected to tracks of MOA 308a-308e to contact the inputs and the output of AOI logic circuit 200. MOB 306c, which is electrically coupled to gate 322a, is electrically coupled to MOA 308a by diagonal via 312a for input B2 at 206; MOB 306e, which is electrically coupled to gate 322b, is electrically coupled to MOA 308c by vertical via 310a for input B1 at 208; MOB 306f, which is electrically coupled to gate 322c, is electrically coupled to MOA 308d by vertical via 310b for input A1 at 210; and MOB 306g, which is electrically coupled to gate 322d, is electrically coupled to MOA 308e by vertical via 310c for input A2 at 212. Also, MOB 306d, which is electrically coupled to MD 314f and MD 314g, is electrically coupled to MOA 308b by diagonal via 312b for output ZN. Thus, diagonal vias 312a and 312b are used to connect to input B2 and output ZN.

Figure 11:
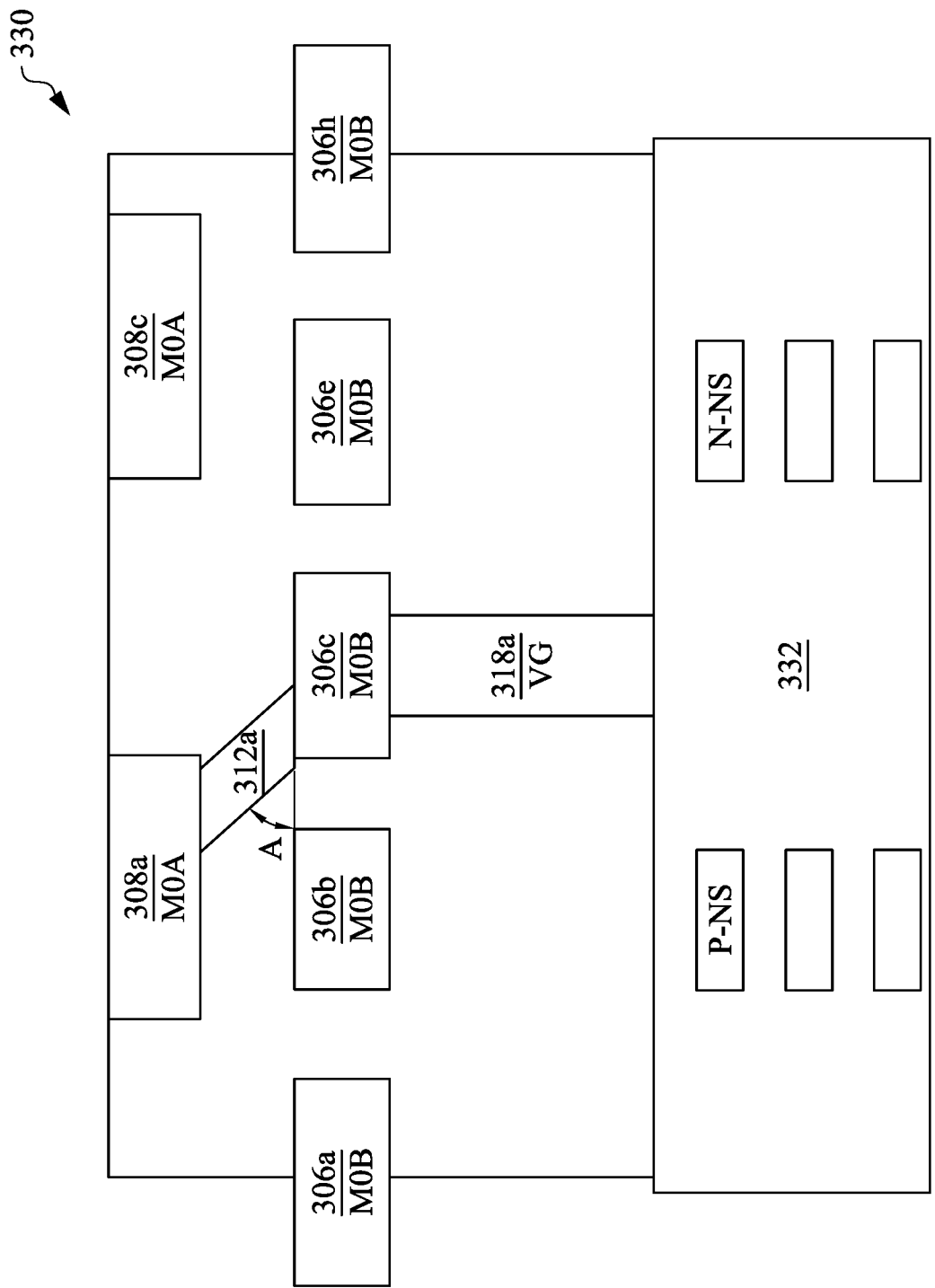
FIG. 11 is a diagram schematically illustrating a cross-section of the layout taken along the line B-B' in FIG. 10, in accordance with some embodiments.

FIG. 11 is a diagram schematically illustrating a cross-section 330 of the layout 300 taken along the line B-B' in FIG. 10, in accordance with some embodiments. The cross-section 330 includes the diagonal via 312a electrically connecting MOB 306c and MOA 308a. In some embodiments, the diagonal via 312a extends at an angle A from MOB 306c in a range from 30 degrees to 45 degrees to electrically couple MOB 306c and MOA 308a together. In some embodiments, the diagonal via 312a extends at an angle A from MOB 306c to electrically couple MOB 306c and MOA 308a together. Other ranges for the angle A are within the scope of the disclosure. In general, angle A may be determined to provide the desired connection between MOB 306c and MOA 308a based on the relative vertical locations (i.e., lateral displacement) thereof and the horizontal space therebetween.

The cross-section 330 includes MOA 308a and 308c, MOB 306a-306c, 306e and 306h, VG 318a, and diagonal via 312a electrically connecting MOB 306c and MOA 308a. The MOB 306a-306c, 306e and 306h are parallel with the MOA 308a and 308c and each extends into and out of the page. The cross-section 330 further includes the gate region 332 for the PMOS transistor 202a and the NMOS transistor 204a The pitch of MOA 308a and 308c is larger than the pitch of MOB 306a-306c, 306e and 306h, such that MOB 306c does not lie vertically beneath MOA 308a. This makes contacting input B2 at 206 by electrically connecting MOB 306c and MOA 308a difficult. The problem is solved by extending diagonal via 312a at a diagonal between MOB 306c and MOA 308a to electrically connect MOB 306c and MOA 308a together.

Figure 12:
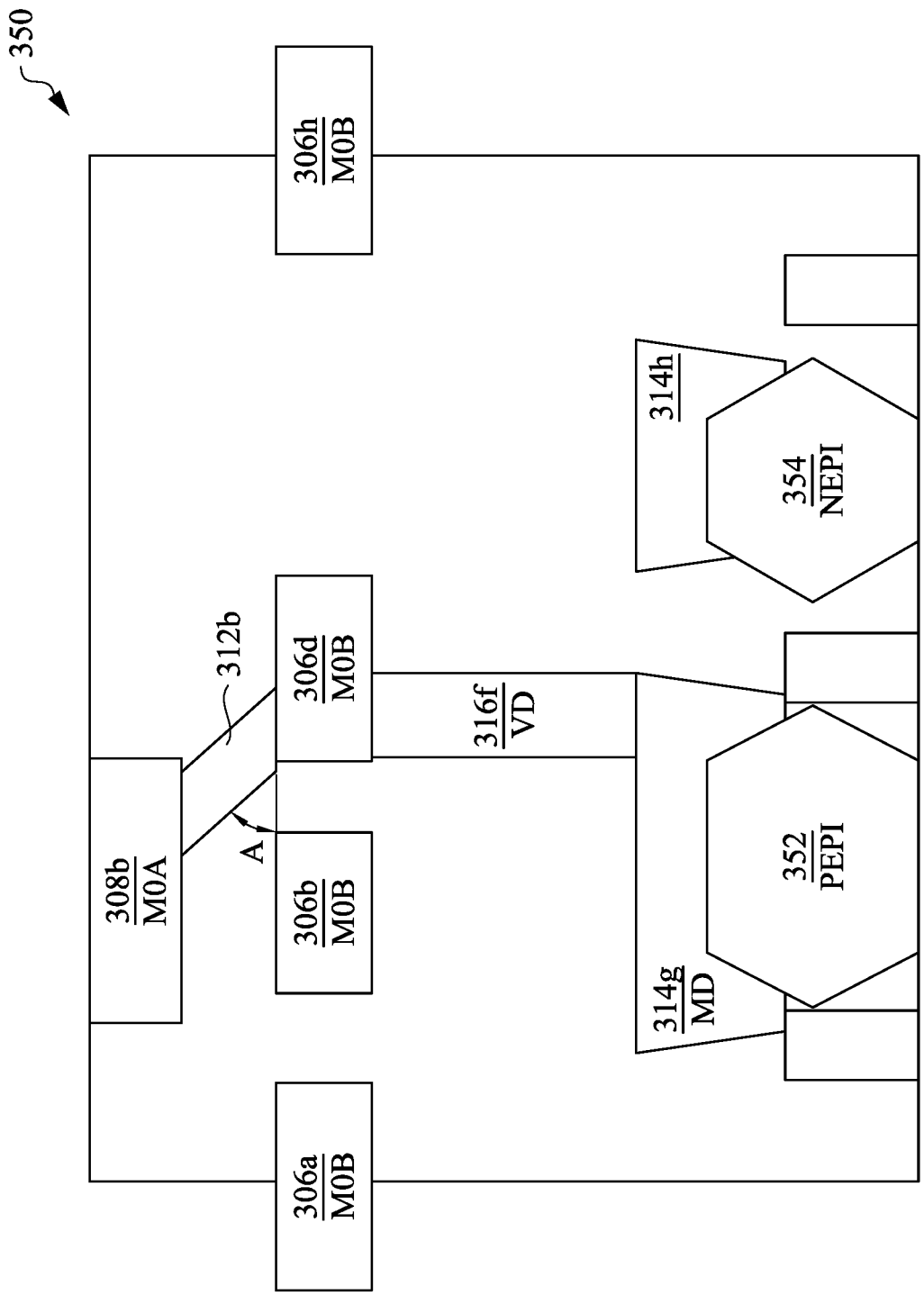
FIG. 12 is a diagram schematically illustrating a cross-section of the layout taken along the line C-C' in FIG. 10, in accordance with some embodiments.

FIG. 12 is a diagram schematically illustrating a cross-section 350 of the layout 300 taken along the line C-C' in FIG. 10, in accordance with some embodiments. The cross-section 350 includes the diagonal via 312b electrically connecting MOB 306d and MOA 308b. In some embodiments, the diagonal via 312b extends at an angle A from MOB 306d in a range from 30 degrees to 45 degrees to electrically connect MOB 306d and MOA 308b together. In some embodiments, the diagonal via 312b extends at an angle A from MOB 306d to electrically couple MOB 306d and MOA 308b together. Other ranges for the angle A are within the scope of the disclosure. In general, angle A may be determined to provide the desired connection between MOB 306d and MOA 308b based on the relative vertical locations thereof (i.e., lateral displacement) thereof and the horizontal space therebetween.

The cross-section 350 includes MOA 308b, MOB 306a, 306b, 306d, and 306h, VD 316f, and MD 314g and 314h. The MOB 306a, 306b, 306d, and 306h are parallel with the MOA 308b and each extends into and out of the page.

MD 314g corresponds to the drain/source path at 218 of PMOS transistors 202c and 202d and is electrically coupled to MOB 306d by VD 316f. MD 314g is on the P epitaxial region 352 and MD 314h is on the N epitaxial region 354.

The pitch of MOA 308b is larger than the pitch of MOB 306a, 306b, 306d and 306h, such that MOB 306d does not lie vertically beneath MOA 308b. This makes contacting output Zn by electrically connecting MOB 306d and MOA 308b difficult. The problem is solved by extending diagonal via 312b at a diagonal between MOB 306d and MOA 308b to electrically couple MOB 306d and MOA 308b together.

Figure 13:
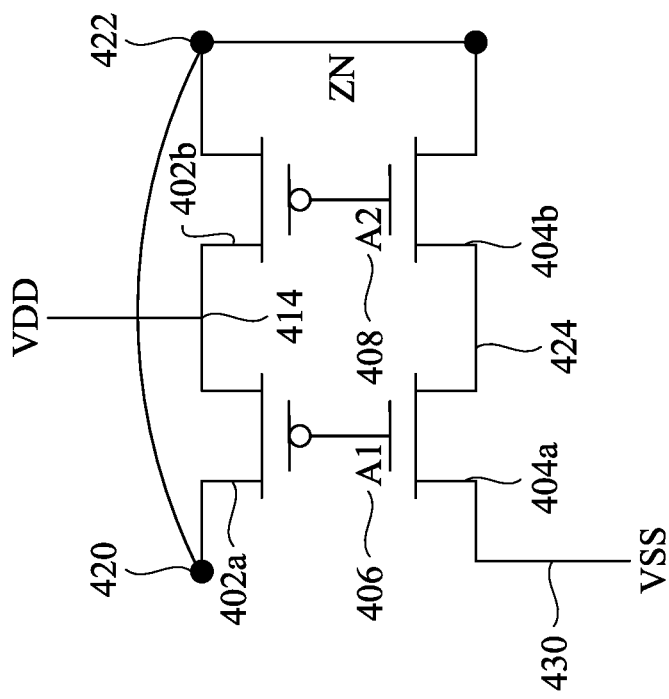
FIG. 13 is a diagram schematically illustrating a nand gate logic circuit, in accordance with some embodiments.

FIG. 13 is a diagram schematically illustrating a nand gate logic circuit 400, in accordance with some embodiments. The nand gate logic circuit 400 is an ND2D1 logic circuit having two inputs A1 and A2 and one output ZN with a driving strength of 1. The nand gate logic circuit 400 includes a 2-input (A1 and A2) nand gate function.

The nand gate logic circuit 400 includes four MOSFETs, two PMOS transistors 402a and 402b and two NMOS transistors 404a and 404b. The gate of PMOS transistor 402a is electrically coupled to the gate of NMOS transistor 404a at input A1 406. The gate of PMOS transistor 402b is electrically coupled to the gate of NMOS transistor 404b at input A2 408.

The drain/source paths of the PMOS transistors 402a and 402b are electrically coupled together. One side of the drain/source path of PMOS transistor 402a is electrically coupled to one side of the drain/source path of PMOS transistor 402b and to power, such as VDD, at 414. The other side of the drain/source path of PMOS transistor 402a at 420 is electrically coupled to the other side of the drain/source path of PMOS transistor 402b at 422.

The drain/source paths of the NMOS transistors 404a and 404b are also electrically coupled together. One side of the drain/source path of NMOS transistor 404a is electrically coupled to one side of the drain/source path of NMOS transistor 404b at 424. The other side of the drain/source path of NMOS transistor 404a is electrically coupled to a reference, such as VSS, at 430. The other side of the drain/source path of NMOS transistor 404b is electrically coupled to the drain/source path of PMOS transistor 402a and the drain/source path of PMOS transistor 402b at 422, which is the output ZN.

FIG. 14 is a diagram schematically illustrating a layout 440 of the nand gate logic circuit 400, in accordance with some embodiments. The layout 440 includes an upper level layout portion 442 and a lower level layout portion 444. In some embodiments, layout 440 is an example of a stagger height cell structure.

The upper level layout portion 402 includes a lower or bottom first metal layer MOB 446a-446e, an upper or top first metal layer MOA 448a-448c, two vertical vias 450a and 450b, and one diagonal via 452. The lower level layout portion 444 includes MDs 454a-454e, VDs 456a-456d, and VGs 458a and 458b. Each of the MOB 446a-446e is parallel to each of the MOA 448a-448c.

The layout 440 includes the nand gate logic circuit 400, including the two PMOS transistors 402a and 402b and the two NMOS transistors 404a and 404b. The two PMOS transistors 402a and 402b and the two NMOS transistors 404a and 404b are laid out as two pair of CMOS transistors. A first pair of transistors 460a includes PMOS transistor 402a and NMOS transistor 404a, and a second pair of transistors 460b includes PMOS transistor 402b and NMOS transistor 404b. The two pair of transistors 460a and 460b are laid out from left to right in the upper and lower level layout portions 442 and 444.

The two pair of transistors 460a and 460b include gates 462a and 462b and drain/source regions 464a-464c on each side of the gates 462a and 462b. The drain/source regions 464a-464c include CMD 466 that define the MDs 454a-454e. The gates 462a and 462b correspond to the inputs A1 406 and A2 408, respectively.

The gate 462a is electrically coupled to MOB 446c by VG 458a for input A1 406, and the gate 462b is electrically coupled to MOB 446d by VG 458b for input A2 408.

Also, MD 454a corresponds to the drain/source path at 420 of PMOS transistor 402a and is electrically coupled to MOB 446b by VD 456a, and MD 454e corresponds to the drain/source path at 422 of PMOS transistor 402b and is electrically coupled to MOB 446b by VD 456d. MD 454e is part of PMOS transistor 402b and NMOS transistor 404b to form the output ZN.

For power, MD 454c corresponds to the drain/source path at 414 of PMOS transistors 402a and 402b and is electrically coupled to MOB 446a by VD 456c for power, such as VDD. Also, for a reference, MD 454b corresponds to the drain/source path at 430 of NMOS transistor 404a and is electrically coupled to MOB 446e by VD 456b for the reference, such as VSS.

In this layout 440, tracks of MOB 446a-446e are electrically connected to tracks of MOA 448a-448c to contact the inputs A1 and A2 and the output ZN of nand gate logic circuit 400. MOB 446c, which is electrically coupled to gate 462a, is electrically coupled to MOA 448b by diagonal via 452 for input A1 at 406. MOB 446d, which is electrically coupled to gate 462b, is electrically coupled to MOA 448c by vertical via 450b for input A2 at 408. Also, MOB 446b, which is electrically coupled to MD 454a and MD 454e, is electrically coupled to MOA 448a by vertical via 450a for output ZN. Thus, diagonal via 452 is used to connect to input A1.

Figure 15:
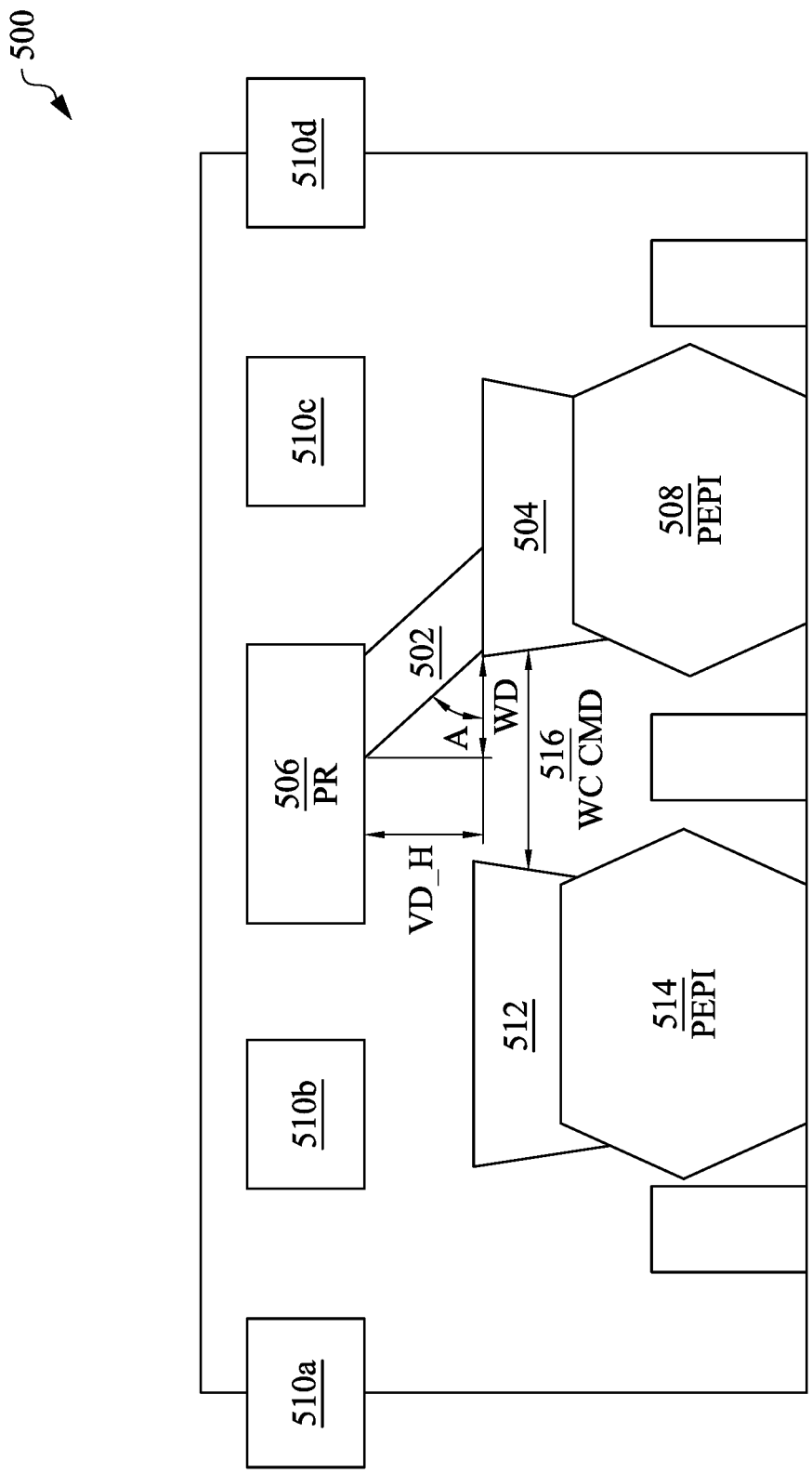
FIG. 15 is a diagram schematically illustrating a portion of an integrated circuit including a diagonal via electrically connecting an MD to a power rail of the integrated circuit, in accordance with some embodiments.

FIG. 15 is a diagram schematically illustrating a portion of an integrated circuit 500 including a diagonal via 502 electrically connecting an MD 504 to a power rail 506 of the integrated circuit 500, in accordance with some embodiments. The diagonal via 502 extends at a diagonal between the MD 504 and the power rail 506 to electrically couple the MD 504 to the power rail 506. In some embodiments, the power rail 506 includes metal.

The integrated circuit 500 includes the diagonal via 502, the MD 504 on a P-epitaxial layer 508, the power rail 506, conductive tracks 510a-510d, and MD 512 on another P-epitaxial layer 514. The power rail 506 is situated above and substantially between the MD 504 and the MD 512, such that a vertical via cannot be used to electrically connect the power rail 506 to the MD 504. Instead, the diagonal via 502 electrically connects the power rail 506 to the MD 504. The power rail 506 is situated a vertical distance or height VD_H above the MD 504, such as above a plane at the top of the MD 504.

The distance between the MD 504 and the MD 512 is a width Wc of CMD 516. In some embodiments, the width Wc of CMD 516 is greater than or equal to 2*Wd, where Wd is the width of the diagonal via 502, which is equal to VD_H/tan A, where the angle A is measured from the plane at the top of MD 504 to the diagonal via 502. In some embodiments, the angle A is in a range from 30 degrees to 45 degrees. Other ranges for the angle A are within the scope of the disclosure. In general, angle A may be determined to provide the desired connection based on the relative vertical locations (i.e. lateral displacement) thereof and the horizontal space therebetween.

Figure 16:
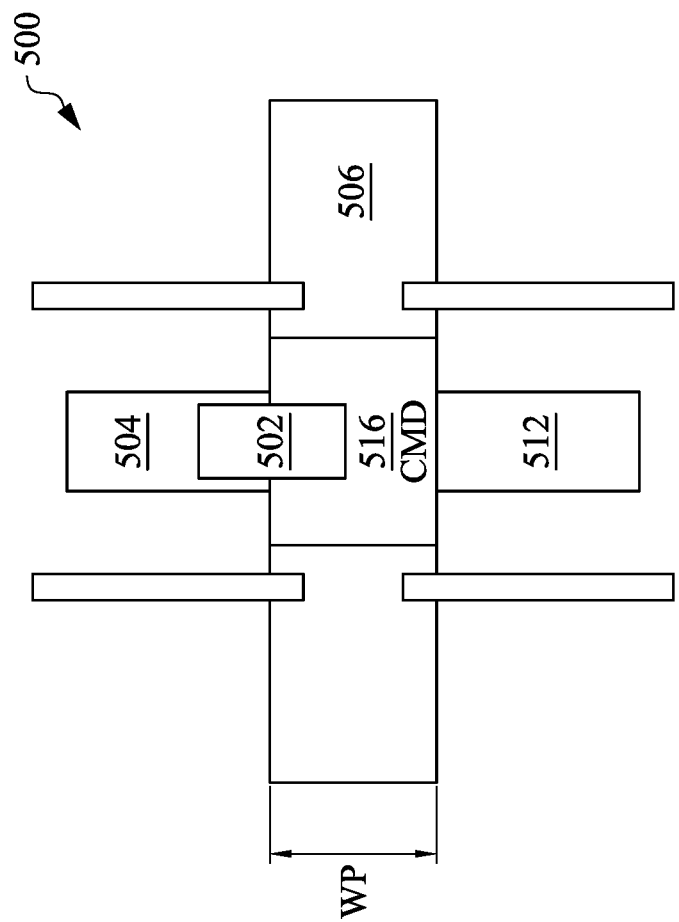
FIG. 16 is a diagram schematically illustrating a top view of the integrated circuit including the MD electrically connected to the power rail by the diagonal via, in accordance with some embodiments.

FIG. 16 is a diagram schematically illustrating a top view of the integrated circuit 500 including the MD 504 electrically connected to the power rail 506 by the diagonal via 502, in accordance with some embodiments. The CMD 516 extends from the MD 504 to the MD 512. The diagonal via 502 extends from the MD 504 to the power rail 506 to electrically connect the MD 504 to the power rail 506. In some embodiments, the power rail 506 has a width Wp that is greater than or equal to 2*TCD, where TCD is the top critical dimension of the diagonal via 502 as illustrated in FIG. 4. In some embodiments, the width Wc of CMD 516 is like the width Wp of the power rail 506.

FIGS. 17-23 are diagrams schematically illustrating how to manufacture diagonal vias, such as diagonal vias 22, 242, 312a, 312b, 452, and 502 described herein, in accordance with some embodiments.

FIG. 17 is a diagram schematically illustrating a semiconductor structure 600 having a first conductive layer 602, a dielectric layer 604 disposed over the first conductive layer 602, and a hard mask 606 disposed on the dielectric layer 604, in accordance with some embodiments. The first conductive layer 602 includes two first conductive tracks 602a and 602b. A base dielectric 608 is disposed along the sides of the two first conductive tracks 602a and 602b. In some embodiments, the two first conductive tracks 602a and 602b include a metal material. In some embodiments, the two first conductive tracks 602a and 602b include at least one of W, Ru, Mo, Co, Cu, Al, TaN, and TiN.

The dielectric layer 604 is disposed on the conductive tracks 602a and 602b of the first conductive layer 602 and on the base dielectric 608. In some embodiments, the base dielectric 608 includes at least one of SiO, SiON, SiOC, SiCN, SiCON, SiOC:H, AlON, AlN, AlO, and ZrO. In some embodiments, the dielectric layer 604 includes at least one of SiO, SiON, SiOC, SiCN, SiCON, SiOC:H, AlON, AlN, AlO, and ZrO. Other materials for the dielectric layer 604 and the base dielectric layer 608 are within the scope of the disclosure.

The hard mask 606 is disposed on the dielectric layer 604. The hard mask 606 includes a hard mask pattern for making the diagonal via. This pattern includes an open space or via 610 through which the diagonal via is etched. In some embodiments, the hard mask 606 includes at least one of SiO, SiN, SiON, Si, Ru, TiN, C, WC, SiOC, CxHyOz, and SiOCH. Other materials for the hard mask 606 are within the scope of the disclosure.

FIG. 18 is a diagram schematically illustrating the semiconductor structure 600 with the dielectric layer 604 etched away to create a diagonally etched cavity 612 through the dielectric layer 604, in accordance with some embodiments. The dielectric layer 604 is etched away in an etching process at an angle A. In some embodiments, the angle A is in a range from 30 degrees to 45 degrees. Other ranges for the angle A are within the scope of the disclosure. In general, angle A may be determined to provide the desired connection based on the relative vertical locations (i.e. lateral displacement) thereof and the horizontal space therebetween.

In the etching process, the dielectric layer 604 is etched away at a diagonal from the hard mask 606 down to the first conductive layer 602 and the conductive track 602b to create the diagonally etched cavity 612 through the dielectric layer 604. In some embodiments, the etching process includes a plasma ion beam etching process.

In some embodiments, etching diagonally through the dielectric layer 604 includes etching a top area or space in the dielectric layer 604 that has at least one of a top length and a top width that is from 10 nm to 50 nm and a bottom area or space that has at least one of a bottom length and a bottom width that is from 5 nm to 50 nm. In some embodiments, etching diagonally through the dielectric layer 604 includes etching a top area or space that has a top critical dimension, such as a length or width of the top area, where the top critical dimension divided by a height from the first conductive layer 602 to a second conductive layer is equal to an aspect ratio of from 0.5 to 2.0. Other aspect ratios are within the scope of the disclosure. In general, the aspect ratio in some examples is determined such that the opening at the top is large enough to permit etching away a sufficient depth of dielectric material to create the appropriate diagonal cavity 612.

Figure 19:
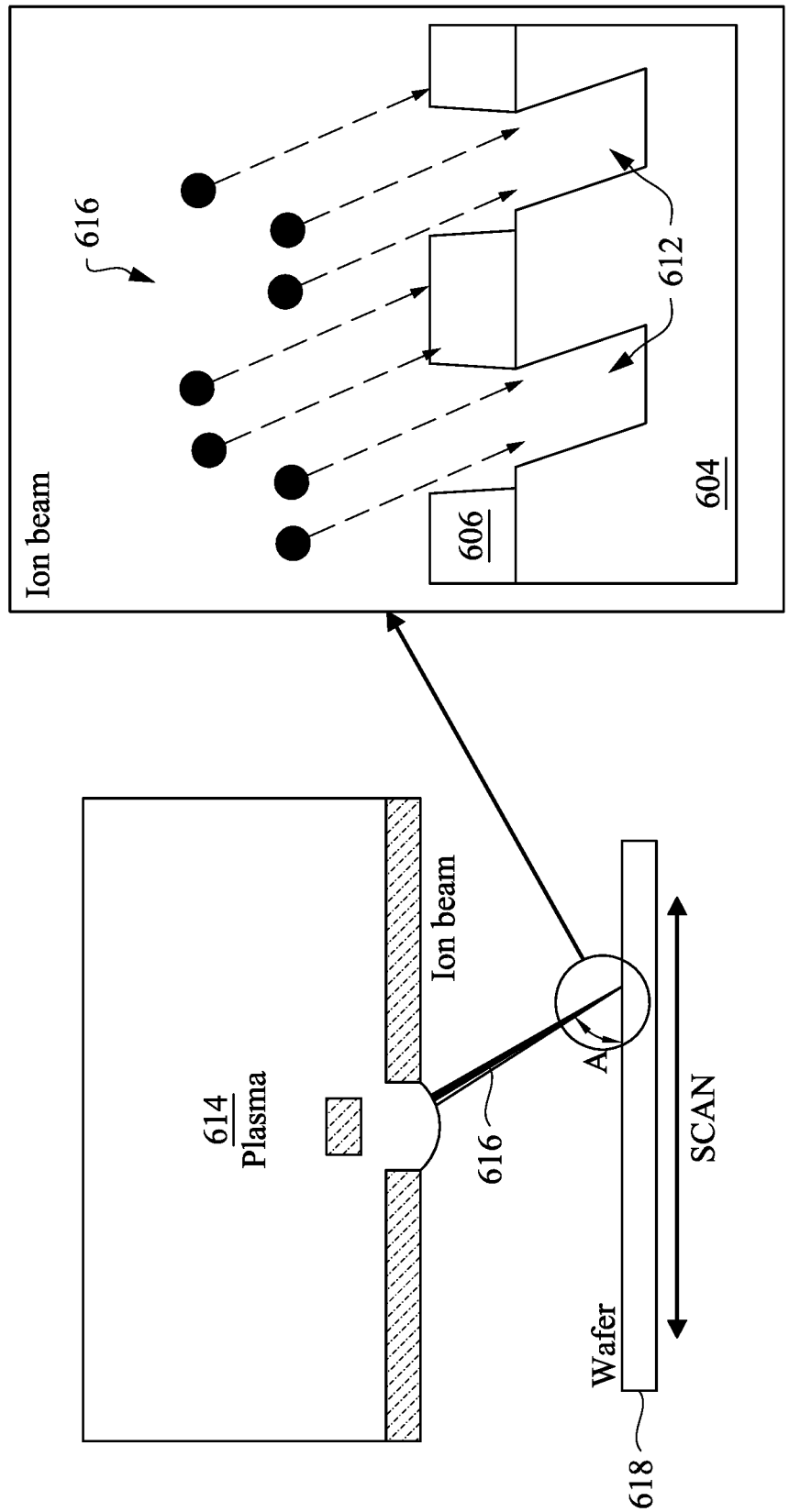
FIG. 19 is a diagram schematically illustrating etching of the dielectric layer using a plasma ion beam etcher in a plasma ion beam etching process, in accordance with some embodiments.

FIG. 19 is a diagram schematically illustrating etching of the dielectric layer 604 using a plasma ion beam etcher 614 in a plasma ion beam etching process, in accordance with some embodiments. The ion beam 616 of the plasma ion beam etcher 614 is angled at an angle A to etch away the dielectric layer 604 and create the diagonally etched cavity 612. The etching technique used to etch the dielectric layer 604 and create the diagonally etched cavity 612 is not limited to plasma ion beam etching. In some embodiments, other etching techniques can be used to etch the dielectric layer 604 and create at least part of the diagonally etched cavity 612. In some embodiments, at least one of reactive ion etching, sputter etching, reactive ion beam etching, and chemically assisted ion beam etching can be used to etch the dielectric layer 604 and create at least part of the diagonally etched cavity 612. In some embodiments, wet etching, such as chemical wet etching, can be used to create at least part of the diagonally etched cavity 612.

In operation, a wafer 618 with the semiconductor structure 600 is scanned past the angled ion beam 616 and/or the angled ion beam 616 is scanned past the wafer 618 to etch away the dielectric layer 604. The dielectric layer 604 is etched away from the hard mask 606 and down to the conductive track 602b to create the diagonally etched cavity 612. In some embodiments, the angle A is in a range from 30 degrees to 45 degrees. In some embodiments, the ion beam 616 includes Ar, O2, CHxFy, Cl2, and HBr. Other ranges for the angle A are within the scope of the disclosure. In general, angle A may be determined to provide the desired connection based on the relative vertical locations (i.e., lateral displacement) thereof and the horizontal space therebetween.

FIG. 20 is a diagram schematically illustrating growing a conductor 620 in the diagonally etched cavity 612 of the dielectric layer 604, in accordance with some embodiments. The conductor 620 is grown in the diagonally etched cavity 612 starting at the conductive track 602b of the conductive layer 602. The conductor 620 is grown up, from the conductive track 602b towards the hard mask 606. In some embodiments, the conductor 620 includes at least one of W, Co, Ru, Mo, Ni, and Nb.

FIG. 21 is a diagram schematically illustrating growing the conductor 620 in the diagonally etched cavity 612 and through the diagonally etched cavity 612 to above the dielectric layer 604, in accordance with some embodiments.

FIG. 22 is a diagram schematically illustrating the semiconductor structure 600 including a diagonal via 622 in the dielectric layer 604 and electrically coupled to the conductive track 602b, in accordance with some embodiments. The conductor 620 that is grown through and above the hard mask 606, also referred to herein as excess conductor, and the hard mask 606 have been removed in a manufacturing process. In some embodiments, the conductor 620 that is grown through and above the hard mask 606 and the hard mask 606 are removed in a chemical mechanical polishing (CMP) process, though other removal processes are within the scope of the disclosure.

FIG. 23 is a diagram schematically illustrating a second conductive layer 624 disposed on the dielectric layer 604, in accordance with some embodiments. The second conductive layer 624 includes second conductive tracks 624a-624c. The second conductive track 624b is electrically coupled to the conductor 620 of the diagonal via 622 to electrically couple the second conductive track 624b to the first conductive track 602b. In some embodiments, the second conductive track 624b includes at least one of W, Ru, Mo, Co, Cu, Al, TaN, and TiN. Other materials for the second conductive track 624b are within the scope of the disclosure.

An upper dielectric layer 626 is formed on the dielectric layer 604 around the second conductive tracks 624a-624c. In some embodiments, the upper dielectric layer 626 includes at least one of SiO, SiON, SiOC, SiCN, SiCON, SiOC:H, AlON, AlN, AlO, and ZrO. Other materials for the upper dielectric layer 626 are within the scope of the disclosure.

The diagonal via 622 electrically connects the first conductive track 602b to the second conductive track 624b. In some embodiments, the diagonal via 622 is like at least one of the diagonal vias 22, 242, 312a, 312b, 452, and 502 described herein.

Figure 24:
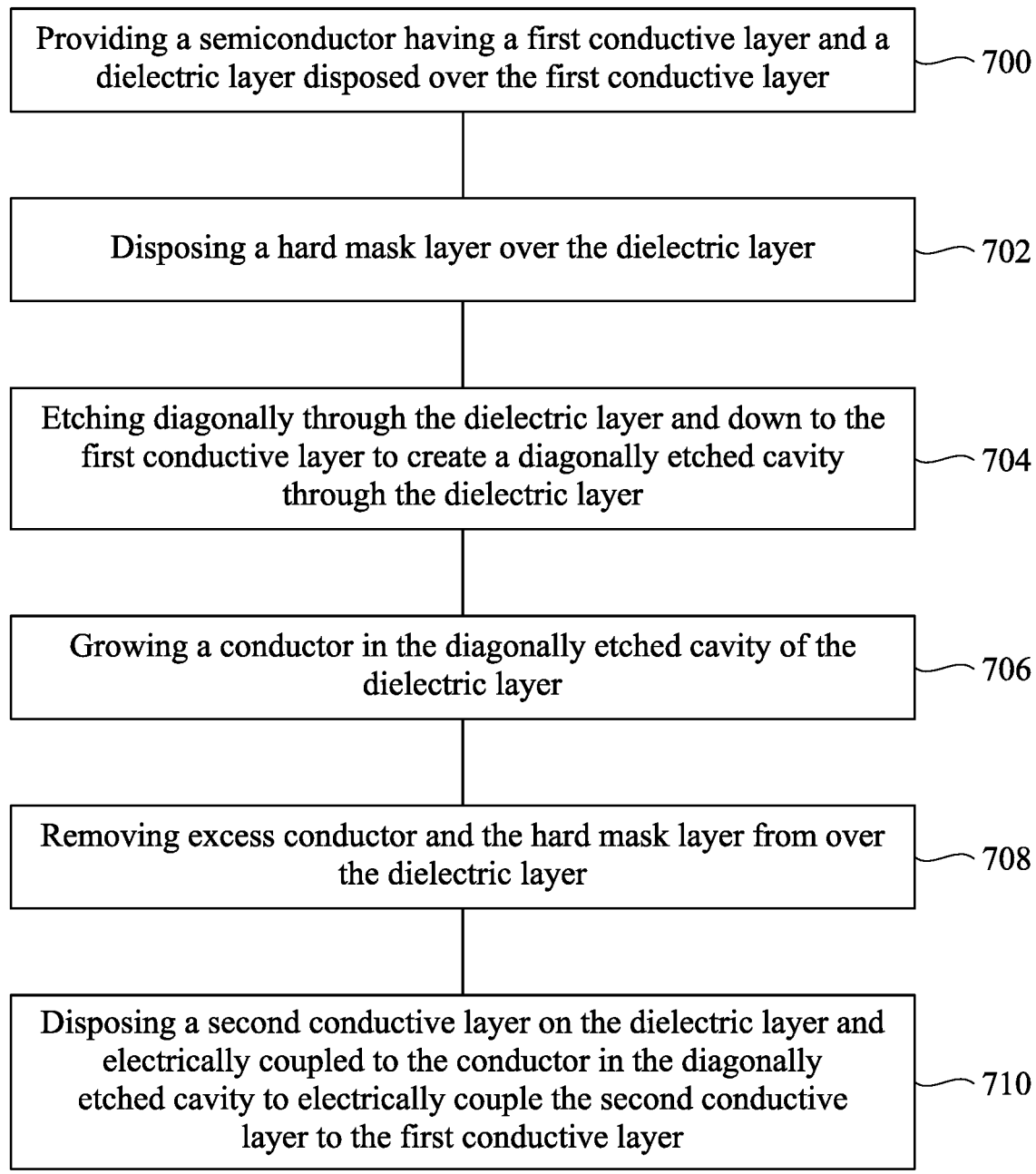
FIG. 24 is a diagram schematically illustrating a method of manufacturing the semiconductor structure, in accordance with some embodiments.

FIG. 24 is a diagram schematically illustrating a method of manufacturing the semiconductor structure 600, in accordance with some embodiments. At 700, the method includes providing the semiconductor structure 600 having a first conductive layer 602 and a dielectric layer 604 disposed over the first conductive layer 602. In some embodiments, the method includes disposing the first conductive layer 602 over a semiconductor substrate and forming the first conductive tracks 602a and 602b in the first conductive layer 602. In some embodiments, the method includes forming the base dielectric layer 608 around the first conductive tracks 602a and 602b.

At 702, the method includes disposing a hard mask 606 over the dielectric layer 604. The hard mask 606 includes a hard mask pattern for making the diagonal via 622. This pattern includes an open space or via 610 through which the diagonal via 622 is etched.

At 704, the method includes etching diagonally through the dielectric layer 604 and down to the first conductive layer 602 to create a diagonally etched cavity 612 through the dielectric layer 604. In some embodiments, etching diagonally through the dielectric layer 604 includes plasma ion beam etching through the dielectric layer 604. In some embodiments, etching diagonally through the dielectric layer 604 includes etching at an angle of from 30 degrees to 45 degrees from the first conductive layer 602.

In some embodiments, etching diagonally through the dielectric layer 604 includes etching a top area having at least one of a top length and a top width that is from 10 nm to 50 nm and a bottom area having at least one of a bottom length and a bottom width that is from 5 nm to 50 nm. In some embodiments, etching diagonally through the dielectric layer includes etching a top area having a top critical dimension, where the top critical dimension divided by a height from the second conductive layer 624 to the first conductive layer 602 is equal to an aspect ratio of from 0.5 to 2.0.

At 706, the method includes growing the conductor 620 in the diagonally etched cavity 612 of the dielectric layer 604. The conductor 620 is grown in the diagonally etched cavity 612 starting at the conductive track 602b of the conductive layer 602 and grown up, from the conductive track 602b towards the hard mask 606 and through the diagonally etched cavity 612 to above the dielectric layer 604.

At 708, the method includes removing excess conductor and the hard mask 606 from over the dielectric layer 604. In some embodiments, the conductor 620 that is through and above the hard mask 606 and the hard mask 606 are removed in a CMP process.

At 710, the method includes disposing a second conductive layer 624 on the dielectric layer 604. The second conductive layer 624 is electrically coupled to the conductor 620 in the diagonally etched cavity 612 (the diagonal via 622) to electrically couple the second conductive layer 624 to the first conductive layer 602.

The second conductive layer 624 includes second conductive tracks 624a-624c. The second conductive track 624b is electrically coupled to the conductor 620 of the diagonal via 622 to electrically couple the second conductive track 624b to the first conductive track 602b. In some embodiments, an upper dielectric layer 626 is formed on the dielectric layer 604 and around the second conductive tracks 624a-624c.

Disclosed embodiments thus provide diagonal vias that solve problems of conductive track crowding and space limitations on an integrated circuit. The diagonal vias alleviate these problems by making it possible to connect one or more components and/or one or more conductive tracks of one conductive layer to a track of another conductive layer that is not directly above the one or more components and/or the one or more conductive tracks.

Also, disclosed embodiments provide diagonal vias that solve problems related to risky long vias, such as super vias from a component to a second conductive layer. The diagonal vias alleviate these problems by making it possible to connect the component to a track of a first conductive layer that is a short vertical distance away and then connect the first conductive layer to the track of the second conductive layer that is a greater vertical distance away using a diagonal via.

In addition, disclosed embodiments provide diagonal vias that connect component MD regions to a power rail, without expanding the MD to be directly under the power rail.

The disclosure further describes a method of manufacturing the diagonal vias, which includes etching a dielectric layer to provide a diagonally etched cavity through the dielectric layer and down to a first conductive track. A conductor is grown in the diagonally etched cavity to create the diagonal via, and a second conductive track is disposed on the via to electrically couple the two tracks.

The diagonal vias adds connectivity to the integrated circuit by making it easier to connect components and conductive layers in the integrated circuit. The diagonal vias reduce the demands on the limited resources of the conductive layers, such as the metal layers, of the integrated circuit.

In accordance with some embodiments, a semiconductor structure includes a first conductive layer, a second conductive layer situated above the first conductive layer, and a via extending diagonally between the second conductive layer and the first conductive layer to electrically connect the first conductive layer to the second conductive layer.

In accordance with further embodiments, a semiconductor structure includes a first metal layer, a second metal layer above the first metal layer, and a via extending diagonally from the second metal layer to the first metal layer. Where a top critical dimension of a top area of the via divided by a height from the second metal layer to the first metal layer is in a range from 0.5 to 2.0.

In accordance with still further disclosed aspects, a method of manufacturing a semiconductor structure includes providing a semiconductor having a first conductive layer and a dielectric layer disposed over the first conductive layer, disposing a hard mask over the dielectric layer, etching diagonally through the dielectric layer and down to the first conductive layer to create a diagonally etched cavity through the dielectric layer, growing a conductor in the diagonally etched cavity of the dielectric layer, removing excess conductor and the hard mask from over the dielectric layer, and disposing a second conductive layer on the dielectric layer and electrically coupled to the conductor in the diagonally etched cavity to electrically couple the second conductive layer to the first conductive layer.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first metal over diffusion contact situated on a first epitaxial layer;
a second metal over diffusion contact situated on a second epitaxial layer and separated from the first metal over diffusion contact by a first distance;
a conductive layer situated above the first metal over diffusion contact and the second metal over diffusion contact and overlapping each of the first metal over diffusion contact and the second metal over diffusion contact; and
a via extending diagonally between the second metal over diffusion contact and the conductive layer to electrically connect the second metal over diffusion contact to the conductive layer,
wherein the via extends diagonally at 30 to 45 degrees from the second metal over diffusion contact and extends a second distance from an edge of the second metal over diffusion contact to a point on the conductive layer that is between the first metal over diffusion contact and the second metal over diffusion contact, such that the first distance is greater than or equal to twice the second distance.

2. The semiconductor structure of claim 1, wherein the via extending diagonally is angled 30 degrees from the second metal over diffusion contact.

3. The semiconductor structure of claim 1, wherein the via includes a top area adjacent the conductive layer and having a top critical dimension, such that the top critical dimension divided by a height from a plane of the conductive layer to a plane of the second metal over diffusion contact is in a range from 0.5 to 2.0.

4. The semiconductor structure of claim 1, wherein the via includes a top area adjacent the conductive layer and having a top critical dimension that is at least one of a top length and a top width and a bottom area adjacent the second metal over diffusion contact and having a bottom critical dimension that is at least one of a bottom length and a bottom width.

5. The semiconductor structure of claim 4, wherein the top critical dimension is from 10 nanometers (nm) to 50 nm and the bottom critical dimension is from 5 nm to 50 nm.

6. The semiconductor structure of claim 1, wherein the via has a top area that is square and a bottom area that is square.

7. The semiconductor structure of claim 1, wherein tracks of the second metal over diffusion contact are orthogonal to tracks of the second-conductive layer.

8. The semiconductor structure of claim 1, wherein tracks of the second metal over diffusion contact are parallel to tracks of the conductive layer.

9. The semiconductor structure of claim 1, wherein the second metal over diffusion contact and the conductive layer are made of the same material.

10. The semiconductor structure of claim 1, wherein the second metal over diffusion contact is connected to a source/drain path of a transistor and the conductive layer is a power rail.

11. A semiconductor structure, comprising:
a first metal over diffusion contact situated on a first epitaxial layer;
a second metal over diffusion contact situated on a second epitaxial layer and the separated from the first metal over diffusion contact by a first distance;
a metal layer above the first metal over diffusion contact and the second metal over diffusion contact and overlapping each of the first metal over diffusion contact and the second metal over diffusion contact; and
a diagonal via extending diagonally from the second metal over diffusion contact to the metal layer, wherein a top critical dimension of a top area of the diagonal via divided by a height from the metal layer to the second metal over diffusion contact is in a range from 0.5 to 2.0,
wherein the diagonal via is angled between 30 and 45 degrees from the second metal over diffusion contact and extends a second distance from an edge of the second metal over diffusion contact to a point on the metal layer that is between the first metal over diffusion contact and the second metal over diffusion contact, such that the first distance is greater than or equal to twice the second distance.

12. The semiconductor structure of claim 11, wherein the diagonal via is angled 30 degrees from the second metal over diffusion contact.

13. The semiconductor structure of claim 11, wherein the top critical dimension is at least one of a top length and a top width and the diagonal via includes a bottom area having a bottom critical dimension that is at least one of a bottom length and a bottom width.

14. The semiconductor structure of claim 13, wherein the top critical dimension is from 10 nm to 50 nm and the bottom critical dimension is from 5 nm to 50 nm.

15. A semiconductor structure, comprising:
a first metal over diffusion contact situated on a first epitaxial layer;
a second metal over diffusion contact situated on a second epitaxial layer and separated from the first metal over diffusion contact by a first distance;
a conductive layer situated above the first metal over diffusion contact and the second metal over diffusion contact and overlapping each of the first metal over diffusion contact and the second metal over diffusion contact; and
a via extending diagonally between the second metal over diffusion contact and the conductive layer, wherein the via includes a top area adjacent the send-conductive layer and having a top critical dimension that is at least one of a top length and a top width and a bottom area adjacent the second metal over diffusion contact and having a bottom critical dimension that is at least one of a bottom length and a bottom width,
wherein the via extends diagonally at 30 to 45 degrees from the second metal over diffusion contact and extends a second distance from an edge f the second metal over diffusion contact to a point on the conductive layer that is between the first metal over diffusion contact and the second metal over diffusion contact, such that the first distance is greater than or equal to twice the second distance.

16. The semiconductor structure of claim 15, wherein the via extending diagonally is angled 30 degrees from the second metal over diffusion contact.

17. The semiconductor structure of claim 15, wherein the top critical dimension divided by a height from a plane of the conductive layer to a plane of the second metal over diffusion contact is in a range from 0.5 to 2.0.

18. The semiconductor structure of claim 15, wherein the top critical dimension is from 10 nanometers (nm) to 50 nm and the bottom critical dimension is from 5 nm to 50 nm.

19. The semiconductor structure of claim 15, wherein tracks of the second metal over diffusion contact are orthogonal to tracks of the conductive layer.

20. The semiconductor structure of claim 15, wherein tracks of the second metal over diffusion contact are parallel to tracks of the conductive layer.

\* \* \* \* \*